(12) United States Patent
Kim et al.

(10) Patent No.: US 11,476,341 B2
(45) Date of Patent: Oct. 18, 2022

(54) SEMICONDUCTOR DEVICE

(71) Applicant: Samsung Electronics Co., Ltd., Suwon-si (KR)

(72) Inventors: Ju Youn Kim, Suwon-si (KR); Sang Jung Kang, Suwon-si (KR); Jin Woo Kim, Hwaseong-si (KR); Seul Gi Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 56 days.

(21) Appl. No.: 17/105,868

(22) Filed: Nov. 27, 2020

(65) Prior Publication Data

US 2021/0328030 A1 Oct. 21, 2021

(30) Foreign Application Priority Data

Apr. 16, 2020 (KR) ........................ 10-2020-0045834

(51) Int. Cl.
*H01L 29/417* (2006.01)
*H01L 29/06* (2006.01)
*H01L 29/786* (2006.01)

(52) U.S. Cl.
CPC ...... *H01L 29/4175* (2013.01); *H01L 29/0669* (2013.01); *H01L 29/78696* (2013.01)

(58) Field of Classification Search
CPC ............. H01L 29/4175; H01L 29/0669; H01L 29/78696; H01L 21/82345; H01L 27/088; H01L 21/28088; H01L 21/28114; H01L 21/823821; H01L 21/823842; H01L 27/092; H01L 27/0924; H01L 29/0673; H01L 29/42376; H01L 29/42392; H01L 29/4966; H01L 29/66439; H01L 29/775; H01L 29/66545; H01L 27/0922; H01L 21/82385; H01L 21/823871; H01L 23/481; H01L 29/66772; H01L 29/78654; B82Y 10/00

USPC ........................................................ 257/343

See application file for complete search history.

(56) References Cited

U.S. PATENT DOCUMENTS 9,401,362 B2 7/2016 Zang
9,583,584 B2 2/2017 Park et al.
9,728,462 B2 8/2017 Fan et al.
10,002,940 B2 6/2018 Cho et al.

(Continued)

*Primary Examiner* — Tong-Ho Kim
(74) *Attorney, Agent, or Firm* — Muir Patent Law, PLLC

(57) ABSTRACT

A semiconductor device is provided. The semiconductor device includes a substrate including a first region and a second region, a first gate structure extending in a first direction on the first region of the substrate, the first gate structure including a first gate insulation film and a first work function film disposed on the first gate insulation film, and a second gate structure extending in the first direction on the second region of the substrate, the second gate structure including a second gate insulation film and a second work function film disposed on the second gate insulation film, wherein a first thickness of the first work function film in a second direction intersecting the first direction is different from a second thickness of the second work function film in the second direction, and wherein a first height of the first work function film in a third direction perpendicular to the first and second directions is different from a second height of the second work function film in the third direction.

18 Claims, 23 Drawing Sheets

(56) References Cited

U.S. PATENT DOCUMENTS

| | | | |
|---|---|---|---|
| 10,128,236 B2 | 11/2018 | Jeong et al. | |
| 10,128,241 B2 | 11/2018 | Kim et al. | |
| 2016/0284699 A1* | 9/2016 | Jeong | H01L 29/42376 |
| 2018/0166443 A1* | 6/2018 | Kim | H01L 29/7851 |
| 2019/0019794 A1* | 1/2019 | Kim | H01L 29/66545 |
| 2019/0348516 A1 | 11/2019 | Ramaswamy et al. | |
| 2019/0348517 A1 | 11/2019 | Wang et al. | |

\* cited by examiner

SEMICONDUCTOR DEVICE

This application claims priority under 35 U.S.C. § 119 to Korean Patent Application No. 10-2020-0045834, filed on Apr. 16, 2020, in the Korean Intellectual Property Office, the disclosure of which is incorporated herein in its entirety by reference.

BACKGROUND

1. Technical Field

The present disclosure relates to a semiconductor device.

2. Description of the Related Art

Recently, with rapid spread of information media, functions of semiconductor devices have also been dramatically developed. In semiconductor products, low cost in manufacture and/or operation is beneficial for securement of competitiveness, and high integration of products is beneficial for miniaturization of products. For high integration, semiconductor devices are being scaled down.

On the other hand, as a pitch size decreases, it is beneficial to reduce capacitance between elements/signal lines and to secure electrical stability between contacts in semiconductor devices.

SUMMARY

Aspects of the present disclosure provide a semiconductor device capable of effectively controlling threshold voltages (Vt) of transistors in different regions, by differently forming thicknesses and heights of work function films of gate structures of transistors each disposed in different regions.

According to an exemplary embodiment of the present disclosure, there is provided a semiconductor device comprising a substrate including a first region and a second region, a first gate structure extending in a first direction on the first region of the substrate, the first gate structure including a first gate insulation film and a first work function film disposed on the first gate insulation film, and a second gate structure extending in the first direction on the second region of the substrate, the second gate structure including a second gate insulation film and a second work function film disposed on the second gate insulation film, wherein a first thickness of the first work function film in a second direction intersecting the first direction is different from a second thickness of the second work function film in the second direction, and wherein a first height of the first work function film in a third direction perpendicular to the first and second directions is different from a second height of the second work function film in the third direction.

According to an exemplary embodiment of the present disclosure, there is provided a semiconductor device comprising a substrate including a first region and a second region, a first gate structure extending in a first direction on the first region of the substrate, the first gate structure including a first work function film and a first filling conductive film disposed inside a first recess defined by the first work function film, and a second gate structure extending in the first direction on the second region of the substrate, the second gate structure including a second work function film and a second filling conductive film disposed inside a second recess defined by the second work function film, wherein a first width of the first filling conductive film disposed inside the first recess in a second direction intersecting the first direction is different from a second width of the second filling conductive film disposed inside the second recess in the second direction, and wherein a first height of the first work function film in a third direction perpendicular to the first and second directions is different from a second height of the second work function film in the third direction.

According to an exemplary embodiment of the present disclosure, there is provided a semiconductor device comprising a substrate including an NMOS region and a PMOS region, a first active pattern extending in a first direction on the NMOS region of the substrate, a first gate structure extending in a second direction intersecting the first direction on the first active pattern of the NMOS region, the first gate structure including a first gate insulation film, a first work function film conformally formed on the first gate insulation film, and a first filling conductive film disposed on the first work function film, a second active pattern extending in the first direction on the PMOS region of the substrate, a second gate structure extending in the second direction on the second active pattern of the PMOS region, the second gate structure including a second gate insulation film, a second work function film conformally formed on the second gate insulation film, and a second filling conductive film disposed on the second work function film, a first source/drain region disposed on at least one side of the first gate structure, and a second source/drain region disposed on at least one side of the second gate structure, wherein a first thickness of the first work function film in the first direction is smaller than a second thickness of the second work function film in the first direction, and wherein a first height of the first work function film in a third direction perpendicular to the first and second directions is smaller than a second height of the second work function film in the third direction.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
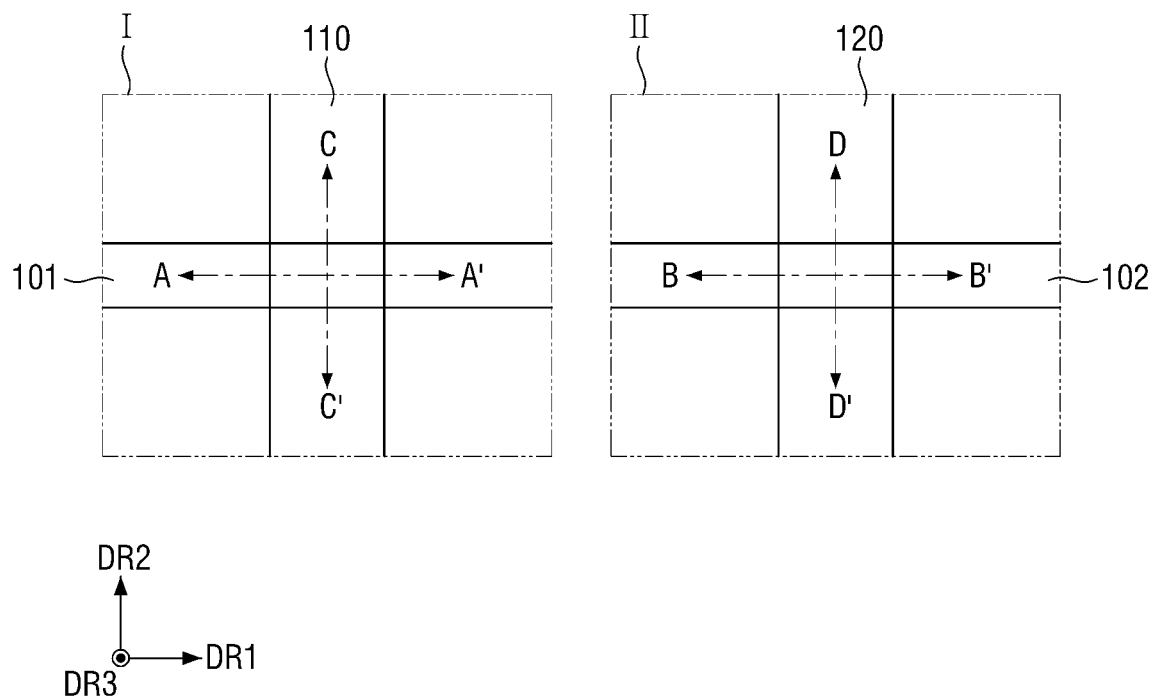
FIG. 1 is a schematic plan view for explaining a semiconductor device according to some embodiments of the present disclosure.

In the drawings of the semiconductor device according to some embodiments, although a fin-type transistor FinFET including a channel region of a fin-type pattern shape, and a transistor including a nanowire or a nanosheet are shown as an example, the present disclosure is not limited thereto. The semiconductor device according to some embodiments may, of course, include a tunneling FET or a three-dimensional (3D) transistor. The semiconductor device according to some embodiments may, of course, include a planar transistor. The semiconductor device according to some embodiments may, of course, include a bipolar junction transistor, a lateral diffusion metal oxide semiconductor (LDMOS) or the like.

Semiconductor devices according to some embodiments of the present disclosure will be described below with reference to FIGS. 1 to 3.

FIG. 1 is a schematic plan view for explaining a semiconductor device according to some embodiments of the present disclosure. FIG. 2 is a cross-sectional view taken along lines A-A' and B-B' of FIG. 1. FIG. 3 is a cross-sectional view taken along lines C-C' and D-D' of FIG. 1.

Figure 2:
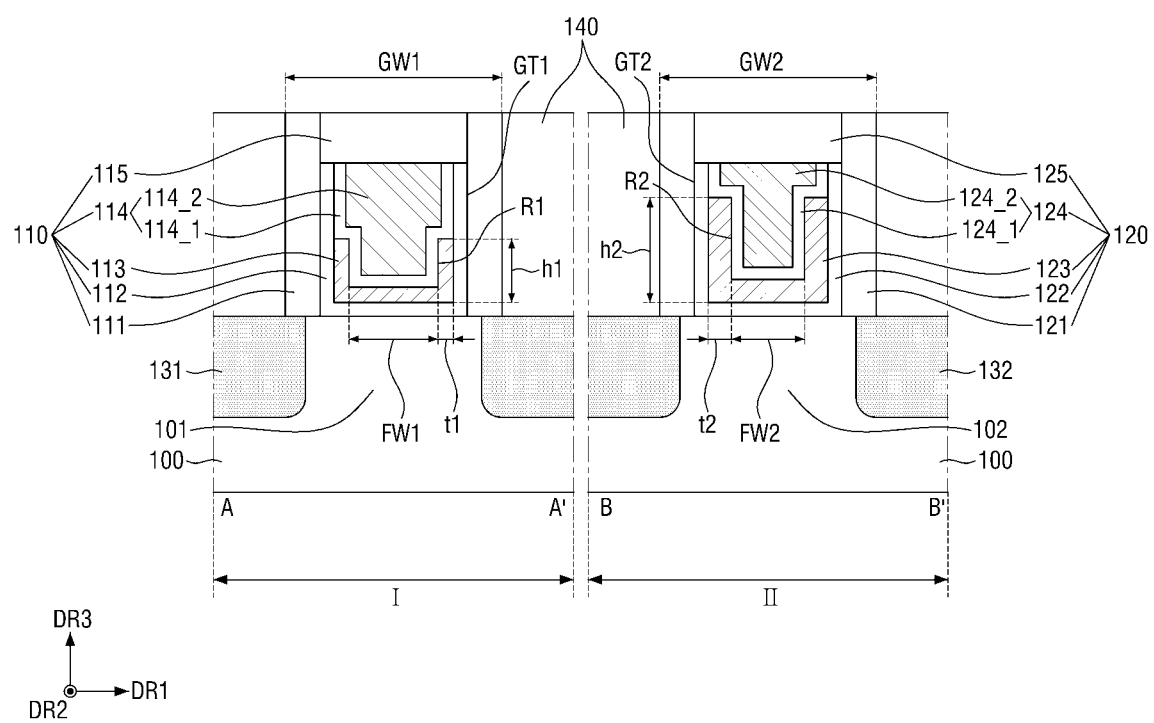
FIG. 2 is a cross-sectional view taken along lines A-A' and B-B' of FIG. 1.
Figure 3:
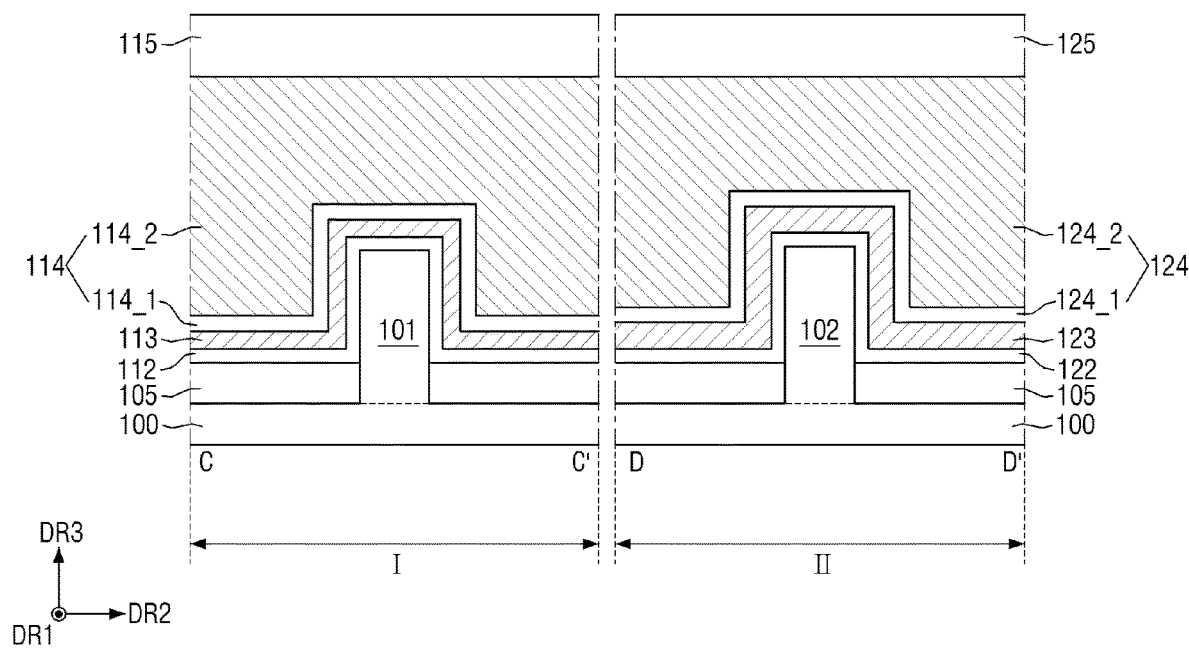
FIG. 3 is a cross-sectional view taken along lines C-C' and D-D' of FIG. 1.

Referring to FIGS. 1 to 3, the semiconductor device according to some embodiments of the present disclosure includes a substrate 100, first and second active patterns 101 and 102, a field insulation film 105, a first gate structure 110, a second gate structure 120, a first source/drain region 131, a second source/drain region 132 and an interlayer insulation film 140.

The substrate 100 may be disposed over a first region I and a second region II. For example, the substrate 100 may include a first region I and a second region II. The first region I may be, for example, an NMOS region. The second region II may be, for example, a PMOS region. However, the present disclosure is not limited thereto. For example, in some other embodiments, both the first region I and the second region II may be NMOS regions. Also, in some other embodiments, both the first region I and the second region II may be PMOS regions. For example, NMOS regions may include NMOS transistors and may not include PMOS transistors, and PMOS regions may include PMOS transistors and may not include NMOS transistors.

The substrate 100 may be bulk silicon or SOI (silicon-on-insulator). Alternatively, the substrate 100 may be a silicon substrate or may include another material, for example, germanium, silicon germanium, indium antimonide, lead telluride, indium arsenide, indium phosphide, gallium arsenide or gallium antimonide. However, the present disclosure is not limited thereto.

The first active pattern 101 may extend in a first direction DR1 on the substrate 100 of the first region I. The second active pattern 102 may extend in the first direction DR1 on the substrate 100 of the second region II.

Each of the first active pattern 101 and the second active pattern 102 may be disposed to protrude from the substrate 100. Each of the first active pattern 101 and the second active pattern 102 may be a part of the substrate 100, and may include an epitaxial layer grown from the substrate 100. Each of the first active pattern 101 and the second active pattern 102 may be defined by the field insulation film 105.

The field insulation film 105 may be disposed on the substrate 100. The field insulation film 105 may be disposed on side walls of each of the first active pattern 101 and the second active pattern 102. Each of the first active pattern 101 and the second active pattern 102 may protrude upward from the upper surface of the field insulation film 105. The field insulation film 105 may include, for example, an oxide film, a nitride film, an oxynitride film or a combination film thereof.

The first gate structure 110 may be disposed on the first active pattern 101 and the field insulation film 105 over the substrate 100 in the first region I. The first gate structure 110 may extend in a second direction DR2 intersecting the first direction DR1. The first gate structure 110 may have a first width GW1 in the first direction DR1.

The first gate structure 110 may include a first gate spacer 111, a first gate insulation film 112, a first work function film 113, a first filling conductive film 114 and a first capping pattern 115.

The first gate spacer 111 may form both side walls of the first gate structure 110 in the first direction DR1. The first gate spacer 111 may extend in the second direction DR2. The first gate spacer 111 may define a first gate trench GT1.

The first gate spacer 111 may include, for example, at least one of silicon nitride (SiN), silicon oxynitride (SiON), silicon oxide (SiO$_2$), silicon oxycarbon nitride (SiOCN), silicon boron nitride (SiBN), silicon oxyboron nitride (SiOBN), silicon oxycarbide (SiOC), and combinations thereof.

The first gate insulation film 112 may be conformally disposed along the side walls and bottom surface of the first gate trench GT1. The first gate insulation film 112 may be disposed along the profile of the first active pattern 101 protruding upward from the field insulation film 105 and an upper surface of the field insulation film 105. Although it is not shown, an interface film may be further disposed along the profile of the first active pattern 101 protruding upward from the field insulation film 105. In this case, the first gate insulation film 112 may be disposed on the interface film. For example, the interface film may be formed between the first gate insulation film 112 and the field insulation film 105. For example, the interface film may be formed between the first gate insulation film 112 and the first active pattern 101.

The first gate insulation film 112 may include silicon oxide, silicon oxynitride, silicon nitride or a high-dielectric constant material having a higher dielectric constant than silicon oxide. The high-dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first work function film 113 may be disposed on the first gate insulation film 112 inside the first gate trench GT1.

The first work function film 113 may be conformally arranged/formed along/on the first gate insulation film 112 formed on the bottom surface and side walls of the first gate trench GT1.

For example, the upper surface of the first work function film 113 may be formed to be lower than the upper surface of the first gate insulation film 112. For example, upper ends of the first gate insulation film 112 and the first work function film 113 formed on a side wall of the first gate trench GT1 may be at different vertical levels from each other. For example, an upper end of the first gate insulation film 112 formed on the side wall of the first gate trench GT1 may be at a higher vertical level than an upper end of the first work function film 113 formed on the sidewall of the first gate trench GT1. However, the present disclosure is not limited thereto. For example, in some other embodiments, the upper surface of the first work function film 113 may be formed on the same plane as the upper surface of the first gate insulation film 112. For example, in certain embodiments, the upper ends of the first work function film 113 and the first gate insulation film 112 formed on a sidewall of the first gate trench GT1 may be at the same vertical level.

The first work function film 113 may have a first thickness t1 in the first direction DR1. For example, the first work function film 113 formed on the sidewall of the first gate trench GT1 may have the first thickness t1 in the first direction DR1. The first work function film 113 may have a first height h1 in a third direction DR3 perpendicular to the first and second directions DR1 and DR2. For example, the first work function film 113 formed on a sidewall of the first gate trench GT1 may have the first height h1 in the third direction DR3. For example, heights in the present disclosure may be vertical lengths of corresponding elements.

The first work function film 113 may include, for example, at least one of TiN, TaN, and a combination thereof.

Although FIG. 2 shows that the first work function film 113 is formed of a single film, the present disclosure is not limited thereto. For example, in some other embodiments, the first work function film 113 may be formed of multi-films, e.g., multilayers of films. In a case that the first work function film 113 is the multi-films, a TiN layer may be formed to be in contact with the first gate insulation film 112, and a TaN layer may be formed on the TiN layer to be in contact with the TiN layer.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

The first filling conductive film 114 may be disposed on the first gate insulation film 112 and the first work function film 113 inside the first gate trench GT1. For example, the first filling conductive film 114 may contact the first work function film 113 at a bottom and on a lower sidewall of the first gate trench GT1, and may contact the first gate insulation film 112 on an upper sidewall of the first gate trench GT1. The first filling conductive film 114 may include a first lower conductive film 114_1 and a first upper conductive film 114_2.

For example, the upper surface of the first filling conductive film 114 may be formed on the same plane as the upper surface of the first gate insulation film 112. For example, the upper surface of the first filling conductive film 114 may be at the same vertical level as the upper end of the first gate insulation film 112. However, the present disclosure is not limited thereto. For example, vertical levels described in the present disclosure may be distances in the third direction DR3 from a plane parallel to the substrate 100 (e.g., from a top or bottom surface of the substrate 100.)

The first filling conductive film 114 may completely fill a first recess R1 defined by the first work function film 113. For example, the upper surface of the first filling conductive film 114 may be at a higher vertical level than the upper end of the first work function film 113 formed on the sidewall of the first gate trench GT1. The first filling conductive film 114 disposed inside the first recess R1 may have a first width FW1 in the first direction DR1.

The first lower conductive film 114_1 may be conformally disposed along the first gate insulation film 112 and the first work function film 113 inside the first gate trench GT1. The first lower conductive film 114_1 may be in contact with each of the first gate insulation film 112 and the first work function film 113.

The first lower conductive film 114_1 may include a material that adjusts a threshold voltage of the semiconductor device, for example, TiAlC.

The first upper conductive film 114_2 may be disposed on the first lower conductive film 114_1 inside the first gate trench GT1. The first upper conductive film 114_2 may be disposed to completely fill a region surrounded by the first lower conductive film 114_1. For example, the top surfaces of the first lower and upper conductive films 114_1 and 114_2 may be coplanar.

Although the first upper conductive film 114_2 may include, for example, tungsten (W), aluminum (Al), cobalt (Co), and the like, the present disclosure is not limited thereto.

The first capping pattern 115 may fill the remaining parts inside the first gate trench GT1. For example, the first capping pattern 115 may be formed on the first gate insulation film 112 and the first filling conductive film 114 inside the first gate trench GT1. The upper surface of the first capping pattern 115 may be formed on the same plane as the upper surface of the first gate spacer 111. For example, the upper surface of the first capping pattern 115 and the upper surface of the first gate spacer 111 may be coplanar and may be disposed at the same vertical level.

The first capping pattern 115 may include, for example, at least one of silicon nitride (SiN), silicon oxynitride (SiON), silicon oxide (SiO$_2$), silicon carbonitride (SiCN), silicon carbide oxynitride (SiOCN), and combinations thereof.

The second gate structure 120 may be disposed on the second active pattern 102 and the field insulation film 105 over the substrate 100 of the second region II. The second gate structure 120 may extend in the second direction DR2. The second gate structure 120 may have a second width GW2 in the first direction DR1. For example, the second width GW2 of the second gate structure 120 in the first direction DR1 may be the same as the first width GW1 of the first gate structure 110 in the first direction DR1. However, the present disclosure is not limited thereto.

The second gate structure 120 may include a second gate spacer 121, a second gate insulation film 122, a second work function film 123, a second lower conductive film 124_1, a second upper conductive film 124_2 and a second capping pattern 125.

Each of the second gate spacer 121, the second gate insulation film 122, the second lower conductive film 124_1, the second upper conductive film 124_2 and the second capping pattern 125 may have a structure similar to or the same as corresponding one of the first gate spacer 111, the first gate insulation film 112, the first lower conductive film 114_1, the first upper conductive film 114_2, and the first capping pattern 115. Therefore, each of the second gate spacer 121, the second gate insulation film 122, the second lower conductive film 124_1, the second upper conductive film 124_2, and the second capping pattern 125 will not be specifically explained.

The second work function film 123 may be disposed on the second gate insulation film 122 inside the second gate trench GT2. The second work function film 123 may be conformally disposed along the second gate insulation film 122.

For example, the upper surface of the second work function film 123 may be formed to be lower than the upper surface of the second gate insulation film 122. For example, upper ends of the second gate insulation film 122 and the second work function film 123 formed on a side wall of the second gate trench GT2 may be in different vertical levels from each other. For example, an upper end of the second gate insulation film 122 formed on the side wall of the second gate trench GT2 may be at a higher vertical level than an upper end of the second work function film 123 formed on the sidewall of the second gate trench GT2. However, the present disclosure is not limited thereto. For example, in some other embodiments, the upper surface of the second work function film 123 may be formed on the same plane as the upper surface of the second gate insulation film 122. For example, in certain embodiments, the upper ends of the second work function film 123 and the second gate insulation film 122 formed on a sidewall of the second gate trench GT2 may be coplanar and at the same vertical level.

The second work function film 123 may have a second thickness t2 in the first direction DR1. For example, the second work function film 123 formed on the sidewall of the second gate trench GT2 may have the second thickness t2 in the first direction DR1. The second thickness t2 of the second work function film 123 in the first direction DR1 may be different from the first thickness t1 of the first work function film 113 in the first direction DR1. For example, the second thickness t2 of the second work function film 123 in the first direction DR1 may be greater than the first thickness t1 of the first work function film 113 in the first direction DR1.

The second work function film 123 may have a second height h2 in the third direction DR3. For example, the second work function film 123 formed on a sidewall of the second gate trench GT2 may have the second height h2 in the third direction DR3. The second height h2 of the second work function film 123 in the third direction DR3 may be different from the first height h1 of the first work function film 113 in the third direction DR3. For example, the second height of the second work function film 123 in the third direction DR3 may be greater than the first height h1 of the first work function film 113 in the third direction DR3.

The second work function film 123 may include, for example, at least one of TiN, TaN, and a combination thereof.

Although FIG. 2 shows that the second work function film 123 is formed of a single film, the present disclosure is not limited thereto. For example, in some other embodiments, the second work function film 123 may be formed of multi-films, e.g., multilayers of films. When the second work function film 123 is the multi-films, a TiN layer may be formed to be in contact with the second gate insulation film 122, and a TaN layer may be formed on the TiN layer to be in contact with the TiN layer.

The second filling conductive film 124 may be disposed on the second gate insulation film 122 and the second work function film 123 inside the second gate trench GT2. For example, the second filling conductive film 124 may contact the second work function film 123 at a bottom and on a lower sidewall of the second gate trench GT2, and may contact the second gate insulation film 122 on an upper sidewall of the second gate trench GT2.

The second filling conductive film 124 may completely fill a second recess R2 defined by the second work function film 123. For example, an upper surface of the second filling conductive film 124 may be at a higher vertical level than the upper end of the second work function film 123 formed on the sidewall of the second gate trench GT2. The second filling conductive film 124 disposed inside the second recess R2 may have a second width FW2 in the first direction DR1. The second width FW2 of the second filling conductive film 124 in the first direction DR1 may be different from the first width FW1 of the first filling conductive film 114 in the first direction DR1. For example, the second width FW2 of the second filling conductive film 124 in the first direction DR1 may be smaller than the first width FW1 of the first filling conductive film 114 in the first direction DR1.

The first source/drain region 131 may be disposed at least on one side of the first gate structure 110 in the first region I. For example, the first source/drain region 131 may be formed on both sides of the first gate structure 110 in the first region I. A second source/drain region 132 may be disposed on at least one side of the second gate structure 120 in the second region II. For example, the second source/drain region 132 may be formed on both sides of the second gate structure 120 in the second region II.

The interlayer insulation film 140 may be disposed on the field insulation film 105. The interlayer insulation film 140 may be formed/disposed to cover sidewalls of the first gate structure 110, sidewalls of the second gate structure 120, the first source/drain region 131 and the second source/drain region 132.

The interlayer insulation film 140 may include at least one of silicon oxide, silicon nitride, silicon oxynitride, and a low-dielectric constant material. The low-dielectric constant materials may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HIVIDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof, but the present disclosure is not limited thereto.

The semiconductor device according to some embodiments of the present disclosure may effectively adjust Vt in different regions, by differently forming thicknesses and heights of the first work function film 113 of the first gate structure 110 and the second work function film 123 of the second gate structure 120 disposed in different regions from each other.

Hereinafter, the semiconductor device according to some other embodiments of the present disclosure will be described with reference to FIG. 4. Differences from the semiconductor device shown in FIGS. 2 and 3 will be mainly described.

Figure 4:
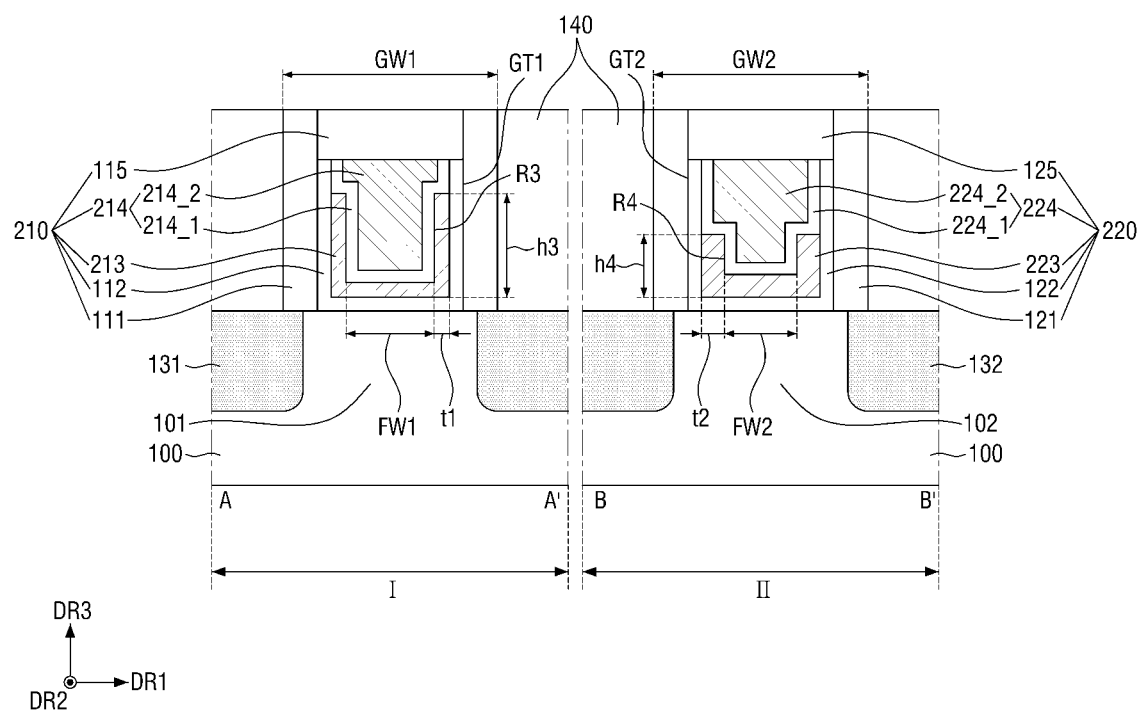
FIG. 4 is a cross-sectional view for explaining a semiconductor device according to some other embodiments of the present disclosure.

FIG. 4 is a cross-sectional view for explaining the semiconductor device according to some other embodiments of the present disclosure.

Referring to FIG. 4, in the semiconductor device according to some other embodiments of the present disclosure, a third height h3 in the third direction DR3 of a first work function film 213 of a first gate structure 210 may be higher than a fourth height h4 in the third direction DR3 of a second work function film 223 of a second gate structure 220.

The first thickness t1 in the first direction DR1 of the first work function film 213 of the first gate structure 210 may be smaller than the second thickness t2 in the first direction DR1 of the second work function film 223 of the second gate structure 220. For example, the first and second thicknesses t1 and t2 may be thicknesses of the first and second work function films 213 and 223 formed on the respective sidewalls of the first and second gate trenches GT1 and GT2.

The first filling conductive film 214 may include a first lower conductive film 214_1, and a first upper conductive film 214_2 disposed on the first lower conductive film 214_1. The second filling conductive film 224 may include a second lower conductive film 224_1, and a second upper conductive film 224_2 disposed on the second lower conductive film 224_1.

The first filling conductive film 214 may completely fill a third recess R3 defined by the first work function film 213. For example, an upper surface of the first filling conductive film 214 may be at a higher vertical level than an upper end of the first work function film 213 formed on the sidewall of the first gate trench GT1. The second filling conductive film 224 may completely fill a fourth recess R4 defined by the second work function film 223. For example, an upper surface of the second filling conductive film 224 may be at a higher vertical level than an upper end of the second work function film 223 formed on the sidewall of the second gate trench GT2.

A first width FW1 in the first direction DR1 of the first filling conductive film 214 disposed inside the third recess R3 may be greater than a second width FW2 in the first direction DR1 of the second filling conductive film 224 disposed inside the fourth recess R4.

Hereinafter, a semiconductor device according to some other embodiments of the present disclosure will be described with reference to FIG. 5. Differences from the semiconductor device shown in FIGS. 2 and 3 will be mainly described.

Figure 5:
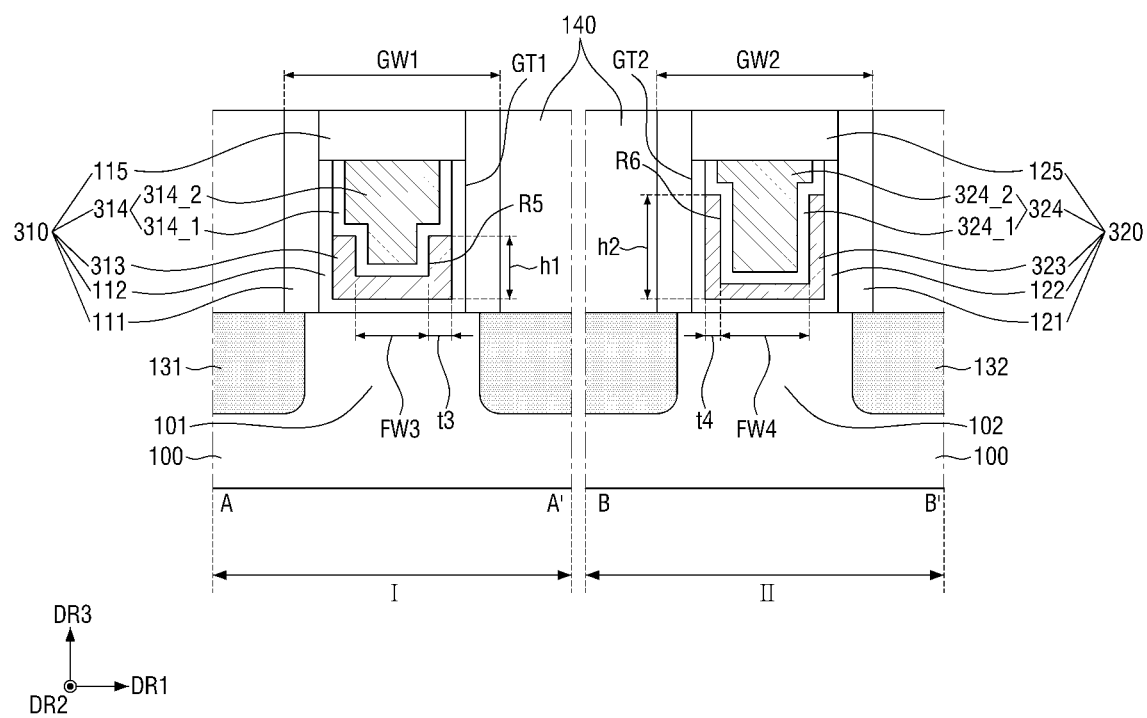
FIG. 5 is a cross-sectional view for explaining a semiconductor device according to some other embodiments of the present disclosure.

FIG. 5 is a cross-sectional view for explaining a semiconductor device according to some other embodiments of the present disclosure.

Referring to FIG. 5, in the semiconductor device according to some other embodiments of the present disclosure, a first height h1 in the third direction DR3 of a first work function film 313 of a first gate structure 310 may be smaller than the second height h2 in the third direction DR3 of a second work function film 323 of a second gate structure 320. For example, the first and second heights h1 and h2 of the first and second work function films 313 and 323 may be heights of portions of the work function films 313 and 323 formed on the respective sidewalls of the first and second gate trenches GT1 and GT2.

A third thickness t3 in the first direction DR1 of the first work function film 313 of the first gate structure 310 may be greater than a fourth thickness t4 in the first direction DR1 of the second work function film 323 of the second gate structure 320. For example, the third and fourth thicknesses t3 and t4 may be thicknesses of the third and fourth work function films 313 and 323 formed on the respective sidewalls of the first and second gate trenches GT1 and GT2.

The first filling conductive film 314 may include a first lower conductive film 314_1, and a first upper conductive film 314_2 disposed on the first lower conductive film 314_1. The second filling conductive film 324 may include a second lower conductive film 324_1, and a second upper conductive film 324_2 disposed on the second lower conductive film 324_1.

The first filling conductive film 314 may completely fill a fifth recess R5 defined by the first work function film 313. The second filling conductive film 324 may completely fill a sixth recess R6 defined by the second work function film 323. For example, an upper surface of the first filling conductive film 314 may be at a higher vertical level than an upper end of the first work function film 313 formed on the sidewall of the first gate trench GT1. For example, an upper surface of the second filling conductive film 324 may be at a higher vertical level than an upper end of the second work function film 323 formed on the sidewall of the second gate trench GT2.

A third width FW3 in the first direction DR1 of the first filling conductive film 314 disposed inside the fifth recess R5 may be smaller than a fourth width FW4 in the first direction DR1 of the second filling conductive film 324 disposed inside the sixth recess R6.

Hereinafter, a semiconductor device according to some other embodiments of the present disclosure will be described with reference to FIGS. 6 and 7. Differences from the semiconductor device shown in FIGS. 1 to 3 will be mainly described.

Figure 6:
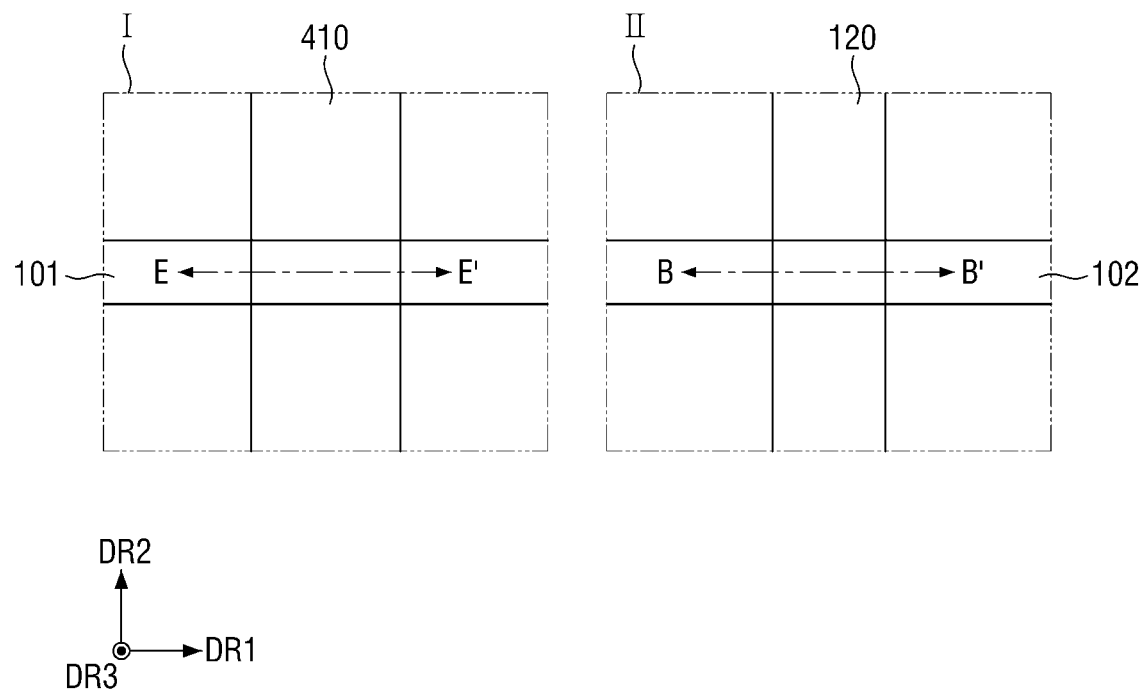
FIG. 6 is a schematic plan view for explaining a semiconductor device according to some other embodiments of the present disclosure.

FIG. 6 is a schematic plan view for explaining the semiconductor device according to some other embodiments of the present disclosure. FIG. 7 is a cross-sectional view taken along lines E-E' and B-B' of FIG. 6.

Figure 7:
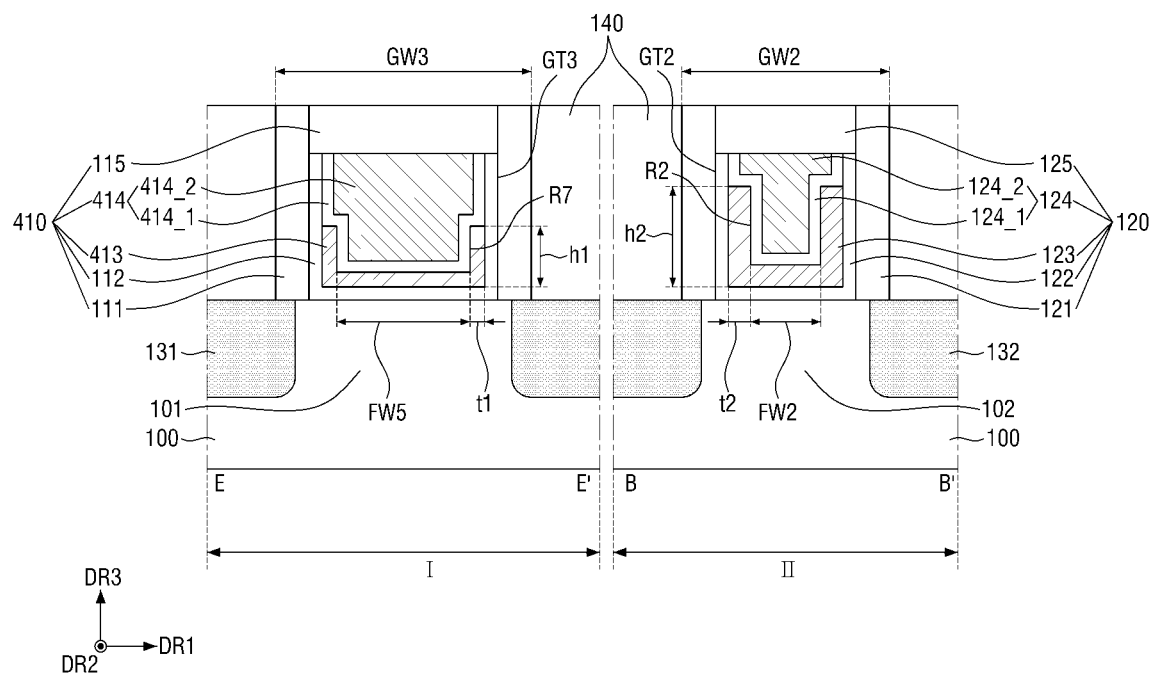
FIG. 7 is a cross-sectional view taken along lines E-E' and B-B' of FIG. 6.

Referring to FIGS. 6 and 7, in the semiconductor device according to some other embodiments of the present disclosure, both the first region I and the second region II may be NMOS regions, or both the first region I and the second region II may be PMOS regions.

A third width GW3 of a first gate structure 410 in the first direction DR1 is greater than a second width GW2 of the second gate structure 120 in the first direction DR1.

A first height h1 in the third direction DR3 of a first work function film 413 of the first gate structure 410 may be smaller than a second height h2 in the third direction DR3 of the second work function film 123 of the second gate structure 120. For example, the first and second heights h1 and h2 of the first and second work function films 413 and 123 may be heights of portions of the work function films 413 and 123 formed on the respective sidewalls of a third gate trench GT3 and the second gate trench GT2 as shown in FIG. 7.

The first thickness t1 in the first direction DR1 of the first work function film 413 of the first gate structure 410 may be smaller than the second thickness t2 in the first direction DR1 of the second work function film 123 of the second gate structure 120. For example, the first and second thicknesses t1 and t2 may be thicknesses of the first and second work function films 413 and 123 formed on the respective sidewalls of the third gate trench GT3 and the second gate trench GT2.

The first gate insulation film 112, the first work function film 413, and the first filling conductive film 414 may be disposed inside a third gate trench GT3 defined by the first gate spacer 111. For example, sidewalls of the third gate trench GT3 may be defined by the first gate spacer 111 and bottom of the third gate trench GT3 may be defined by the first active pattern 101 in a channel area and by the field insulation film 105 in areas other than a channel area.

The first filling conductive film 414 may include a first lower conductive film 414_1, and a first upper conductive film 414_2 disposed on the first lower conductive film 414_1. The first filling conductive film 414 may completely fill a seventh recess R7 defined by the first work function film 413. For example, an upper surface of the first filling conductive film 414 may be at a higher vertical level than an upper end of the first work function film 413 formed on the sidewall of the third gate trench GT3. For example, the upper surface of the first filling conductive film 414 may be at the same vertical level as an upper end of the first gate insulation film 112 formed on the sidewall of the third gate trench GT3 as shown in FIG. 7.

A fifth width FW5 in the first direction DR1 of the first filling conductive film 414 disposed inside the seventh recess R7 may be greater than the second width FW2 in the first direction DR1 of the second filling conductive film 124 disposed inside the second recess R2.

Hereinafter, a semiconductor device according to some other embodiments of the present disclosure will be described with reference to FIG. 8. Differences from the semiconductor device shown in FIGS. 1 to 3 and 5 will be mainly described.

Figure 8:
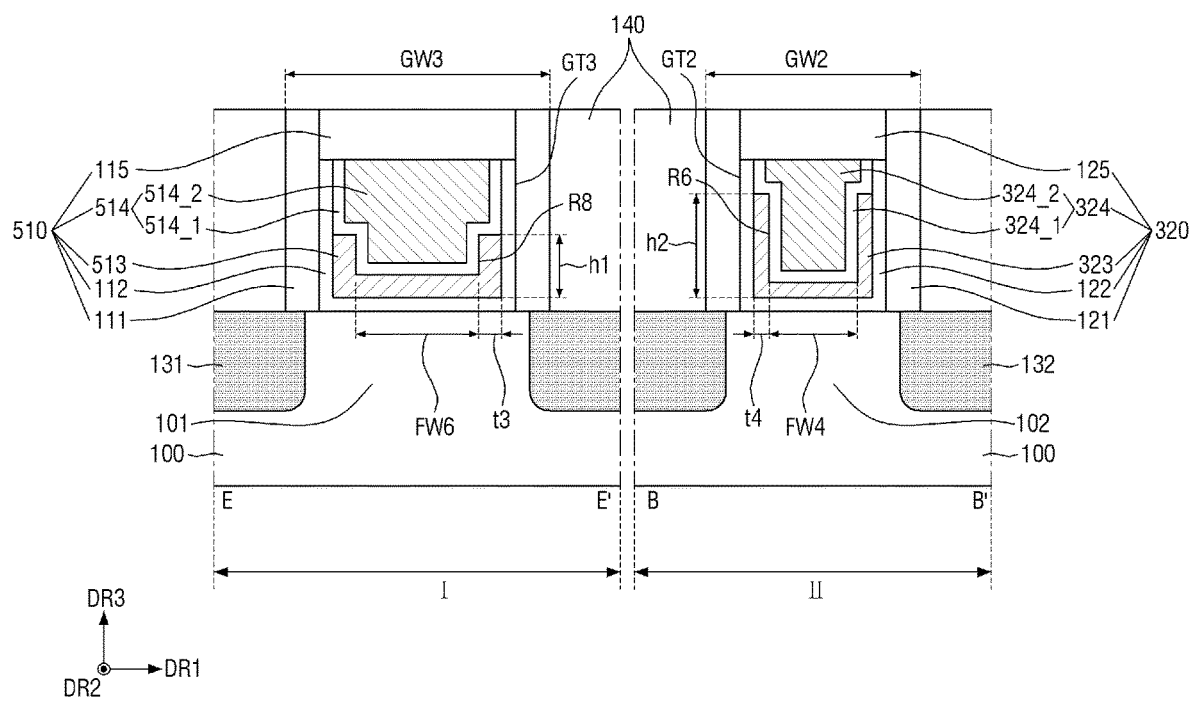
FIG. 8 is a cross-sectional view for explaining a semiconductor device according to some other embodiments of the present disclosure.

FIG. 8 is a cross-sectional view for explaining a semiconductor device according to some other embodiments of the present disclosure.

Referring to FIG. 8, in the semiconductor device according to some other embodiments of the present disclosure, both the first region I and the second region II may be NMOS regions, or both the first region I and the second region II may be PMOS regions.

A third width GW3 of a first gate structure 510 in the first direction DR1 may be greater than the second width GW2 of the second gate structure 320 in the first direction DR1.

A first height h1 in the third direction DR3 of a first work function film 513 of the first gate structure 510 may be smaller than a second height h2 in the third direction DR3 of the second work function film 323 of the second gate structure 320. For example, the first and second heights h1 and h2 of the first and second work function films 513 and 323 may be heights of portions of the work function films 513 and 323 formed on the respective sidewalls of a third gate trench GT3 and the second gate trench GT2 as shown in FIG. 8.

A third thickness t3 in the first direction DR1 of the first work function film 513 of the first gate structure 510 may be greater than a fourth thickness t4 in the first direction DR1 of the second work function film 323 of the second gate structure 320. For example, the third and fourth thicknesses t3 and t4 may be thicknesses of the first and second work function films 513 and 323 formed on the respective sidewalls of the third gate trench GT3 and the second gate trench GT2 as shown in FIG. 8.

The first gate insulation film 112, the first work function film 513, and the first filling conductive film 514 may be disposed inside a third gate trench GT3 defined by the first gate spacer 111. For example, sidewalls of the third gate trench GT3 may be defined by the first gate spacers 111 and bottom of the third gate trench GT3 may be defined by the first active pattern 101 in a channel area as shown in FIG. 8.

The first filling conductive film 514 may include a first lower conductive film 514_1, and a first upper conductive film 514_2 disposed on the first lower conductive film 514_1. The first filling conductive film 514 may completely fill an eighth recess R8 defined by the first work function film 513. For example, an upper surface of the first filling conductive film 514 may be at a higher vertical level than an upper end of the first work function film 513 formed on the sidewall of the third gate trench GT3.

A sixth width FW6 in the first direction DR1 of the first filling conductive film 514 disposed inside the eighth recess R8 may be greater than the fourth width FW4 in the first direction DR1 of the second filling conductive film 324 disposed inside the sixth recess R6.

Hereinafter, a semiconductor device according to some other embodiments of the present disclosure will be described with reference to FIG. 9. Differences from the semiconductor device shown in FIGS. 1 to 4 will be mainly described.

Figure 9:
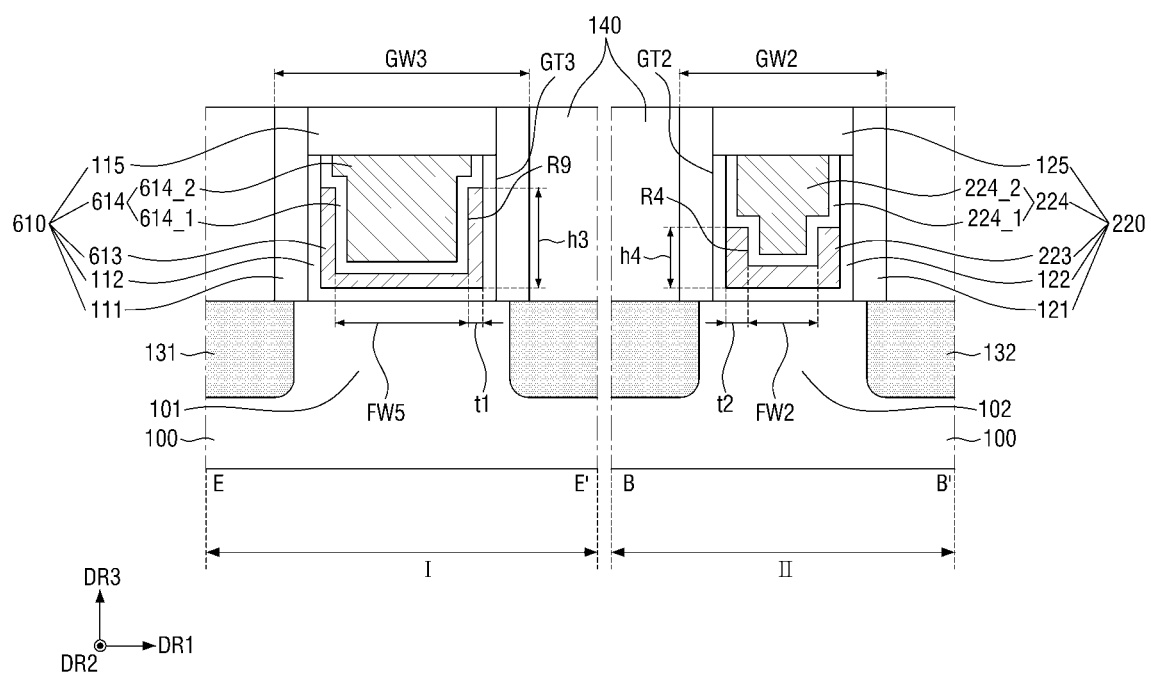
FIG. 9 is a cross-sectional view for explaining a semiconductor device according to some other embodiments of the present disclosure.

FIG. 9 is a cross-sectional view for explaining a semiconductor device according to some other embodiments of the present disclosure.

Referring to FIG. 9, in the semiconductor device according to some other embodiments of the present disclosure, both the first region I and the second region II may be NMOS regions or both the first region I and the second region II may be PMOS regions.

A third width GW3 of a first gate structure 610 in the first direction DR1 may be greater than a second width GW2 of the second gate structure 220 in the first direction DR1.

A third height h3 in the third direction DR3 of a first work function film 613 of the first gate structure 610 may be higher than a fourth height h4 in the third direction DR3 of the second work function film 223 of the second gate structure 220. For example, the third and fourth heights h3 and h4 of the first and second work function films 613 and 223 may be heights of portions of the work function films 613 and 223 formed on the respective sidewalls of a third gate trench GT3 and the second gate trench GT2 as shown in FIG. 9.

The first thickness t1 in the first direction DR1 of the first work function film 613 of the first gate structure 610 may be smaller than the second thickness t2 in the first direction DR1 of the second work function film 223 of the second gate structure 220. For example, the first and second thicknesses t1 and t2 may be thicknesses of the first and second work function films 613 and 223 formed on the respective sidewalls of the third gate trench GT3 and the second gate trench GT2 as shown in FIG. 9.

The first gate insulation film 112, the first work function film 613 and the first filling conductive film 614 may be disposed inside the third gate trench GT3 defined by the first gate spacer 111. For example, sidewalls of the third gate trench GT3 may be defined by the first gate spacers 111 and bottom of the third gate trench GT3 may be defined by the first active pattern 101 in a channel area as shown in FIG. 9.

The first filling conductive film 614 may include a first lower conductive film 614_1, and a first upper conductive film 614_2 disposed on the first lower conductive film 614_1. The first filling conductive film 614 may completely fill a ninth recess R9 defined by the first work function film 613. For example, an upper surface of the first filling conductive film 614 may be at a higher vertical level than an upper end of the first work function film 613 formed on the sidewall of the third gate trench GT3 as shown in FIG. 9.

A fifth width FW5 in the first direction DR1 of a first filling conductive film 614 disposed inside the ninth recess R9 may be greater than a second width FW2 in the first direction DR1 of the second filling conductive film 224 disposed inside the fourth recess R4.

Hereinafter, a semiconductor device according to some other embodiments of the present disclosure will be described with reference to FIGS. 10 and 11. Differences from the semiconductor device shown in FIGS. 1 to 3 will be mainly described.

Figure 10:
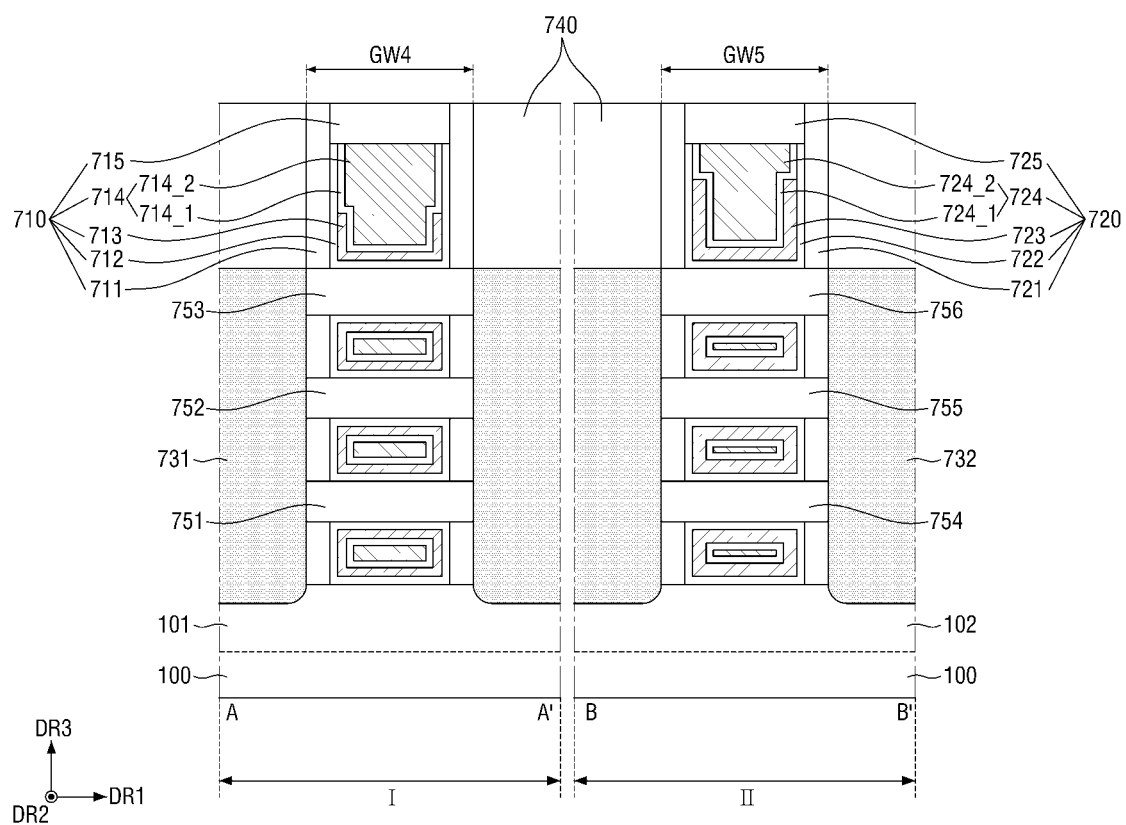
FIGS. 10 and 11 are cross-sectional views for explaining a semiconductor device according to some other embodiments of the present disclosure.
Figure 11:
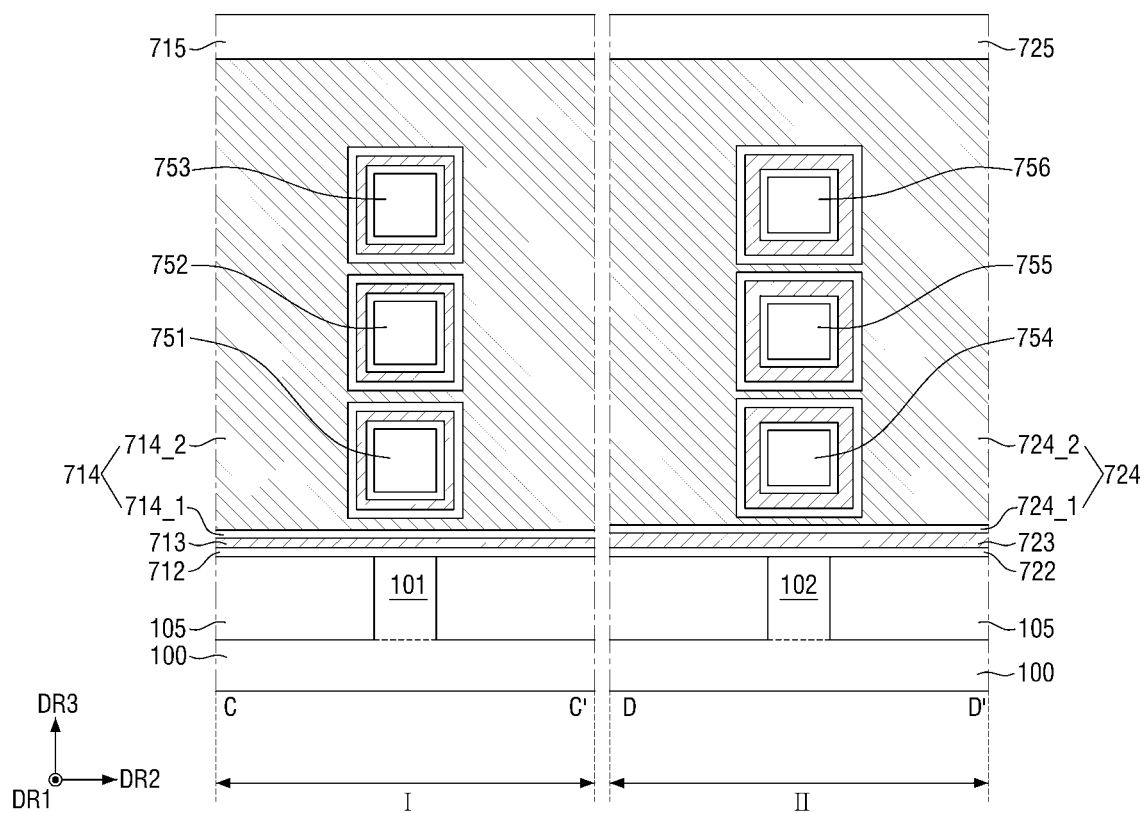

FIGS. 10 and 11 are cross-sectional views for explaining a semiconductor device according to some other embodiments of the present disclosure.

Referring to FIGS. 10 and 11, the semiconductor device according to some other embodiments of the present disclosure may include an MBCFET™ (Multi-Bridge Channel Field Effect Transistor).

For example, the semiconductor device according to some embodiments of the present disclosure may include a plurality of nanowires sequentially stacked on a substrate 100 to be spaced apart from each other in the third direction DR3.

First to third nanowires 751, 752 and 753 may be sequentially stacked on the substrate 100 of the first region I to be spaced apart from each other in the third direction DR3. Fourth to sixth nanowires 754, 755 and 756 may be sequentially stacked on the substrate 100 of the second region II to be spaced apart from each other in the third direction DR3. Each of the first to sixth nanowires 751, 752, 753, 754, 755 and 756 may extend in the first direction DR1.

The first gate structure 710 may surround each of the first to third nanowires 751, 752 and 753, e.g., in a cross-sectional view as shown in FIG. 11. The first gate structure 710 may include a first gate spacer 711, a first gate insulation film 712, a first work function film 713, a first filling conductive film 714 and a first capping pattern 715. The first filling conductive film 714 may include a first lower conductive film 714_1 and a first upper conductive film 714_2.

The second gate structure 720 may surround each of the fourth to sixth nanowires 754, 755 and 756, e.g., in a cross-sectional view as shown in FIG. 11. The second gate structure 720 may include a second gate spacer 721, a second gate insulation film 722, a second work function film 723, a second filling conductive film 724 and a second capping pattern 725. The second filling conductive film 724 may include a second lower conductive film 724_1 and a second upper conductive film 724_2.

A fourth width GW4 of the first gate structure 710 in the first direction DR1 may be the same as a fifth width GW5 of the second gate structure 720 in the first direction DR1.

A first source/drain region 731 may be disposed on at least one side of each of the first to third nanowires 751, 752 and 753. For example, a pair of first source/drain regions 731 may be formed on both sides of the first to third nanowires 751, 752 and 753. A second source/drain region 732 may be disposed on at least one side of each of the fourth to sixth nanowires 754, 755 and 756. For example, a pair of second source/drain regions 732 may be formed on both sides of the fourth to sixth nanowires 754, 755 and 756.

An interlayer insulation film 740 may be disposed to cover sidewalls of the first gate structure 710, sidewalls of the second gate structure 720, the first source/drain region 731 and the second source/drain region 732.

A semiconductor device according to some other embodiments of the present disclosure will be described below with reference to FIG. 12. Differences from the semiconductor device shown in FIGS. 1 to 3 and 10 will be mainly described.

Figure 12:
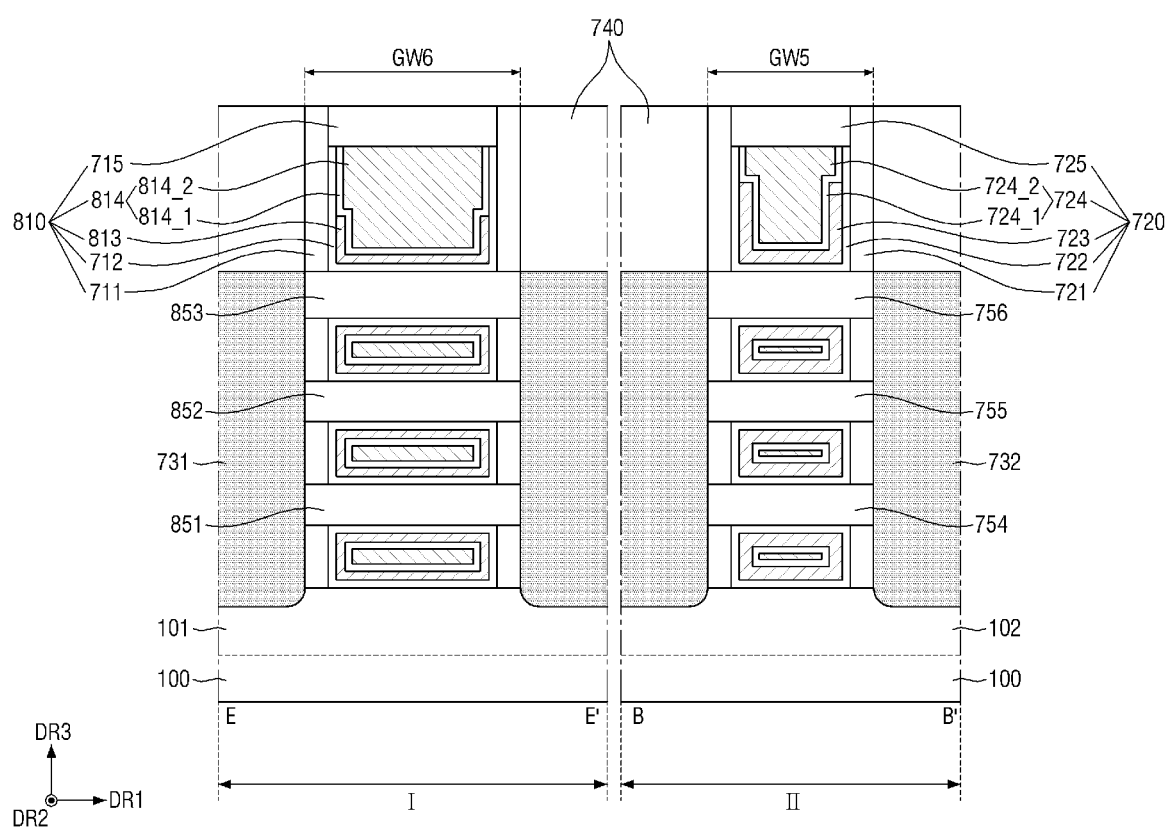
FIG. 12 is a cross-sectional view for explaining a semiconductor device according to some other embodiments of the present disclosure.

FIG. 12 is a cross-sectional view for explaining a semiconductor device according to some other embodiments of the present disclosure.

Referring to FIG. 12, a semiconductor device according to some other embodiments of the present disclosure may include an MBCFET™ (Multi-Bridge Channel Field Effect Transistor).

First to third nanowires 851, 852 and 853 may be sequentially stacked on the substrate 100 of the first region I to be spaced apart from each other in the third direction DR3. Each of the first to third nanowires 851, 852 and 853 may extend in the first direction DR1.

Lengths of each of the first to third nanowires 851, 852 and 853 in the first direction DR1 may be greater than lengths of each of the fourth to sixth nanowires 754, 755 and 756 in the first direction DR1. For example, the lengths of the first to third nanowires 851, 852 and 853 in the first direction DR1 may be greater than respective lengths of the fourth to sixth nanowires 754, 755 and 756 in the first direction DR1.

The first gate structure 810 may surround each of the first to third nanowires 851, 852 and 853. The first gate structure 810 may include a first gate spacer 711, a first gate insulation film 712, a first work function film 813, a first filling conductive film 814 and a first capping pattern 715. The first filling conductive film 814 may include a first lower conductive film 814_1 and a first upper conductive film 814_2.

A sixth width GW6 of the first gate structure 810 in the first direction DR1 may be greater than a fifth width GW5 of the second gate structure 720 in the first direction DR1.

A method for fabricating a semiconductor device according to some embodiments of the present disclosure will be described below with reference to FIGS. 2 and 13 to 23.

FIGS. 13 to 23 are intermediate stage diagrams for explaining the method for fabricating the semiconductor device according to some embodiments of the present disclosure.

Figure 13:
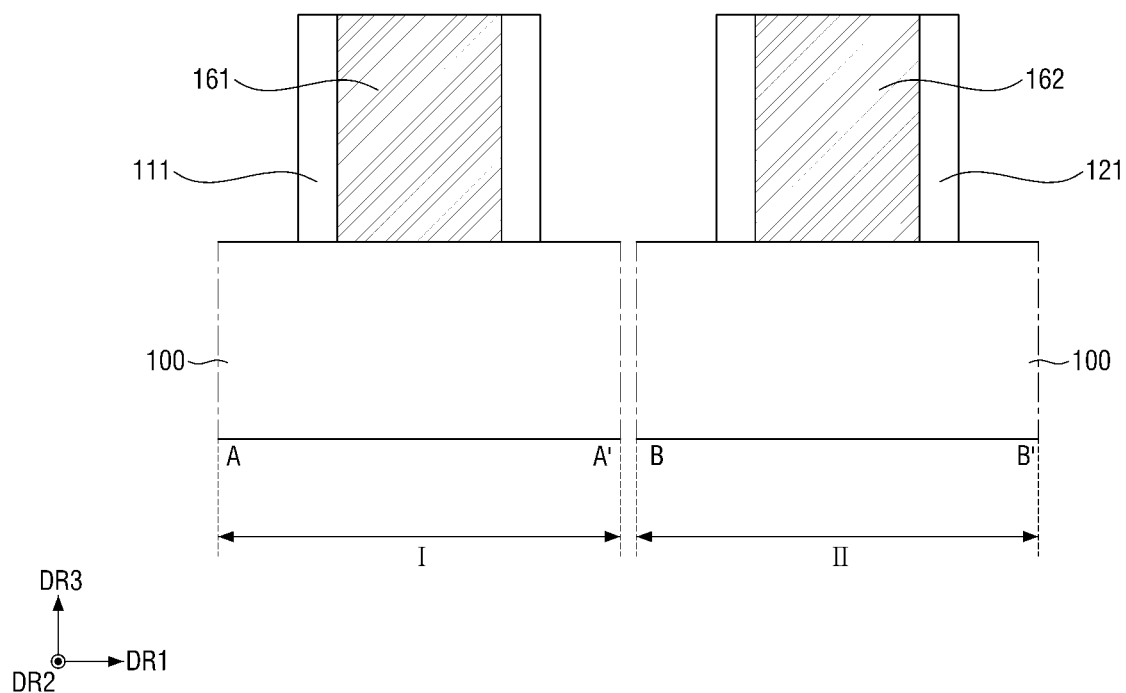
FIGS. 13 to 23 are intermediate stage diagrams for explaining a method for fabricating a semiconductor device according to some embodiments of the present disclosure.

Referring to FIG. 13, a first dummy gate 161 is formed on the substrate 100 of the first region I, and a second dummy gate 162 may be formed on the substrate 100 of the second region II. Each of the first dummy gate 161 and the second dummy gate 162 may extend in the second direction DR2.

Subsequently, a first gate spacer 111 is formed along both side walls of the first dummy gate 161, and a second gate spacer 121 may be formed along both side walls of the second dummy gate 162.

Figure 14:
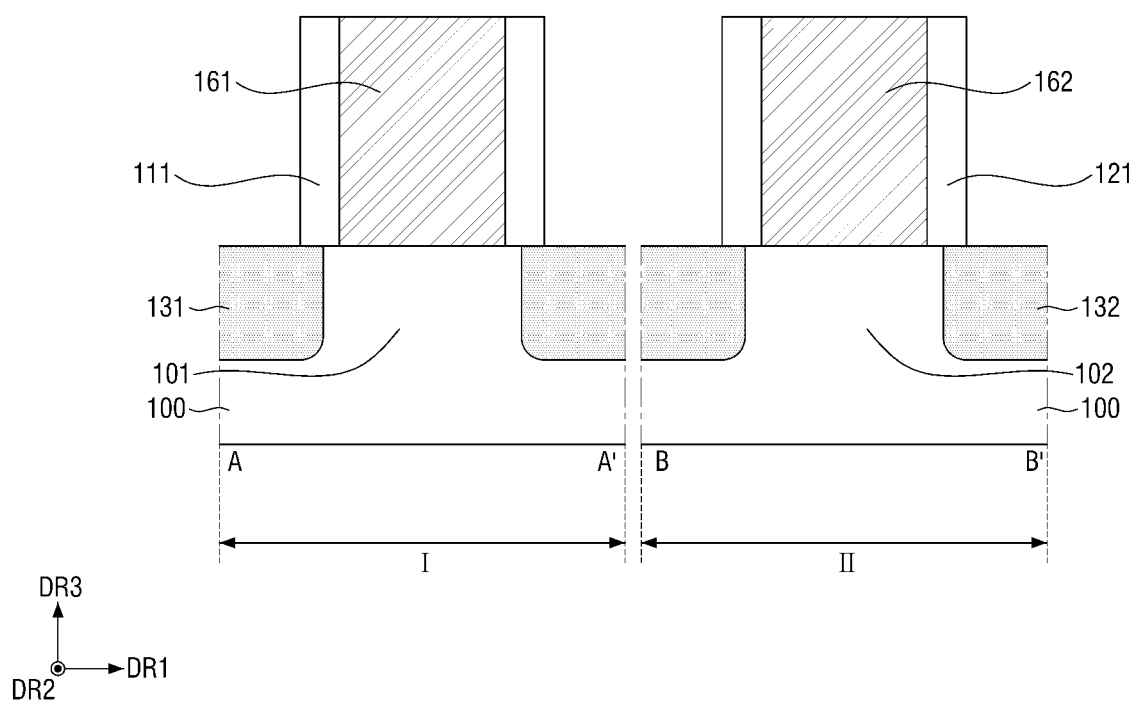

Referring to FIG. 14, the substrate 100 of the first region I may be etched, using the first dummy gate 161 and the first gate spacer 111 as a mask. Also, the substrate 100 of the second region II may be etched, using the second dummy gate 162 and the second gate spacer 121 as a mask.

Next, a first source/drain region 131 is formed in a region in which the substrate 100 of the first region I is etched, and a second source/drain region 132 may be formed in a region in which the substrate 100 of the second region II is etched.

Figure 15:
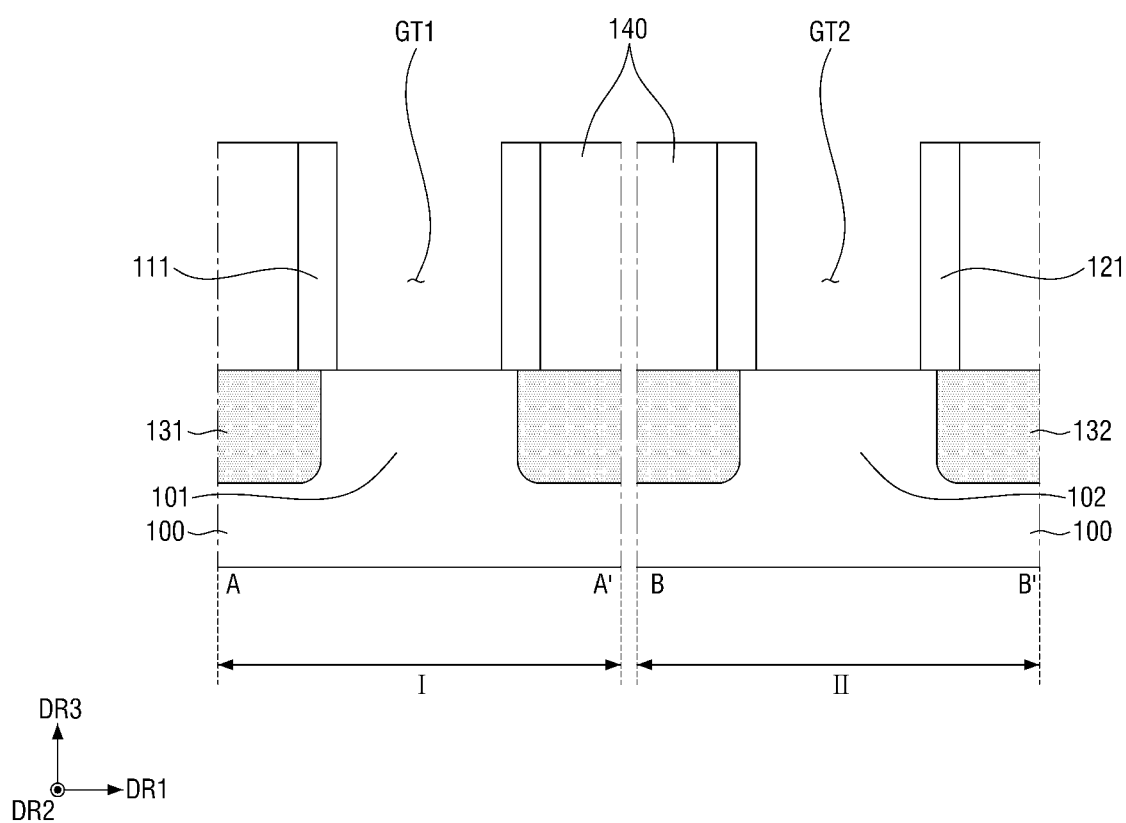

Referring to FIG. 15, an interlayer insulation film 140 is formed to cover the first dummy gate 161, the first gate spacer 111, the second dummy gate 162 and the second gate spacer 121.

Next, a planarization process (e.g., a CMP process) may be performed to expose the upper surfaces of each of the first dummy gate 161 and the second dummy gate 162.

Next, the first dummy gate 161 may be removed to form a first gate trench GT1 between the first gate spacers 111, and the second dummy gate 162 may be removed to form a second gate trench GT2 between the second gate spacers 121.

Figure 16:
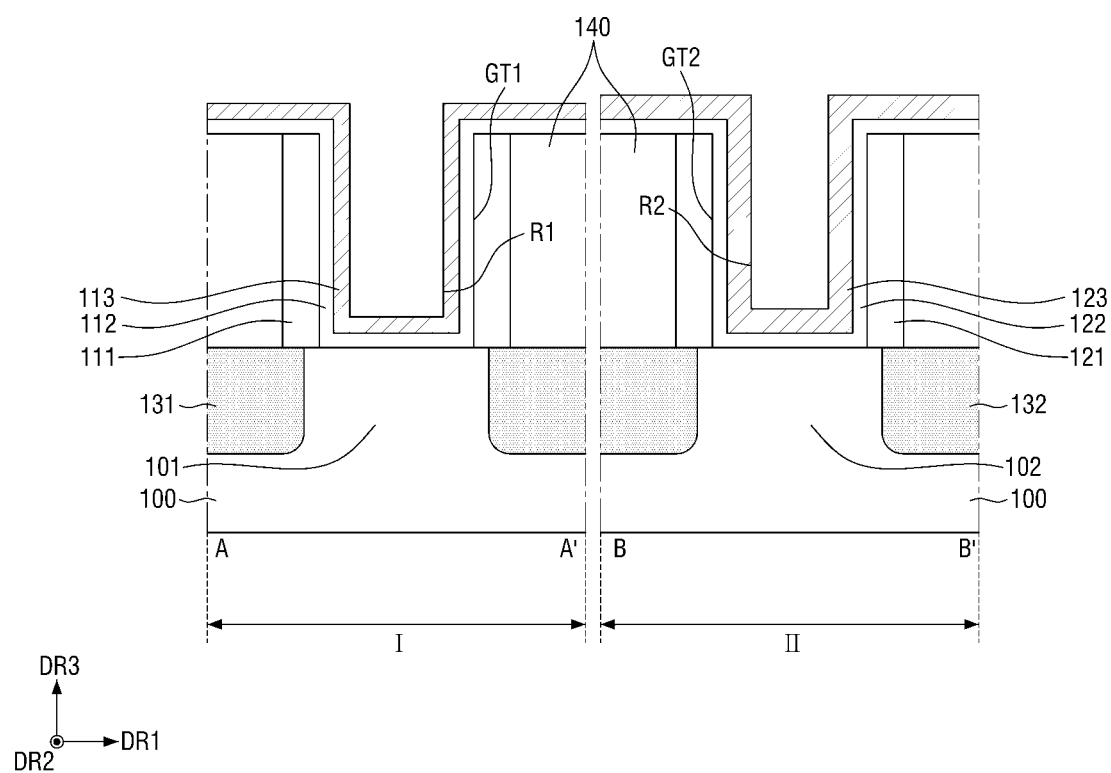

Referring to FIG. 16, the first gate insulation film 112 and the first work function film 113 may be sequentially formed along the upper surface of the interlayer insulation film 140, the upper surface of the first gate spacer 111, and the side walls and bottom surface of the first gate trench GT1.

Further, the second gate insulation film 122 and the second work function films 123 may be sequentially formed along the upper surface of the interlayer insulation film 140, the upper surface of the second gate spacer 121, and the side walls and the bottom surface of the second gate trench GT2.

In this case, the thickness of the second work function film 123 in the first direction DR1 may be formed to be larger than the thickness of the first work function film 113 in the first direction DR1. For example, the thickness of the second work function film 123 in the first direction DR1 on a sidewall of the second gate spacer 121 may be formed to be larger than the thickness of the first work function film 113 in the first direction DR1 on a sidewall of the first gate spacer 111.

Figure 17:
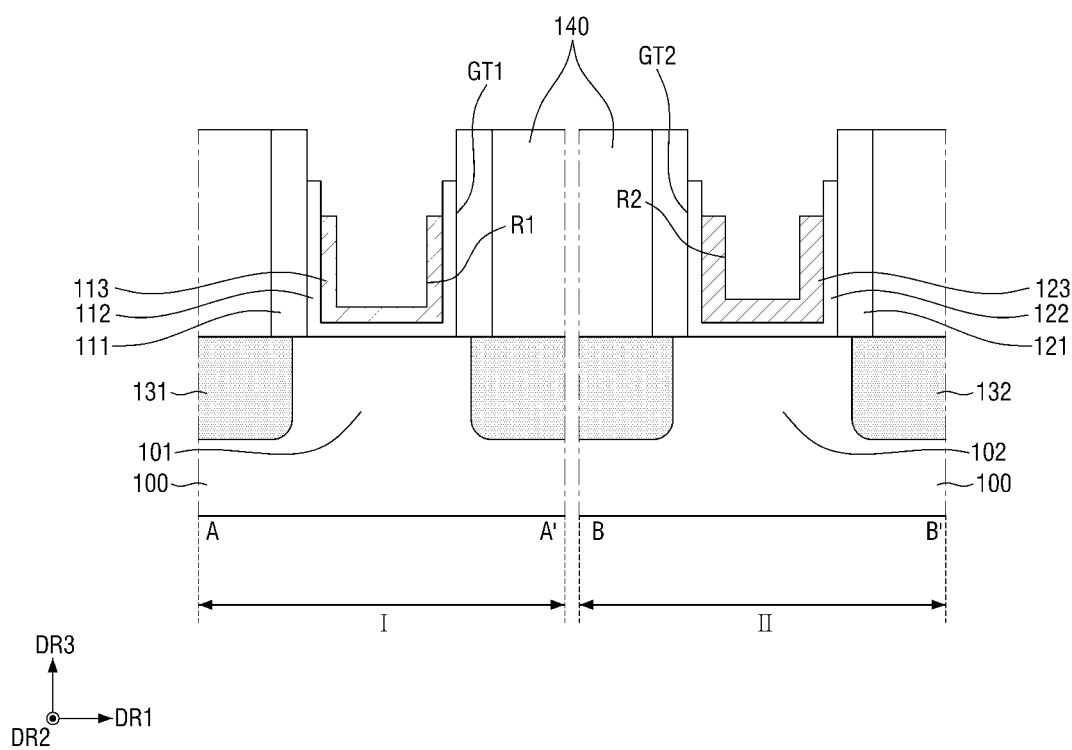

Referring to FIG. 17, in the first region I, the first gate insulation film 112 and the first work function film 113 formed on the upper surface of the interlayer insulation film 140 and the upper surface of the first gate spacer 111 may be removed. In this case, at least a part of the upper side wall of the first gate trench GT1 may be exposed. In addition, at least a part of an upper side wall of the first gate insulation film 112 may be exposed. For example, the upper surface of the first work function film 113 is formed to be lower than the upper surface of the first gate insulation film 112, and the upper surface of the first gate insulation film 112 may be formed to be lower than the upper surface of the first gate spacer 111, e.g., on the sidewalls of the first gate trench GT1.

In the second region II, the second gate insulation film 122 and the second work function film 123 formed on the upper surface of the interlayer insulation film 140 and the upper surface of the second gate spacer 121 may be removed. In this case, at least a part of the upper side wall of the second gate trench GT2 may be exposed. In addition, at least a part of the upper side wall of the second gate insulation film 122 may be exposed. For example, the upper surface of the second work function film 123 is formed to be lower than the upper surface of the second gate insulation film 122, and the upper surface of the second gate insulation film 122 may be formed to be lower than the upper surface of the second gate spacer 121, e.g., on the sidewalls of the second gate trench GT2.

Figure 18:
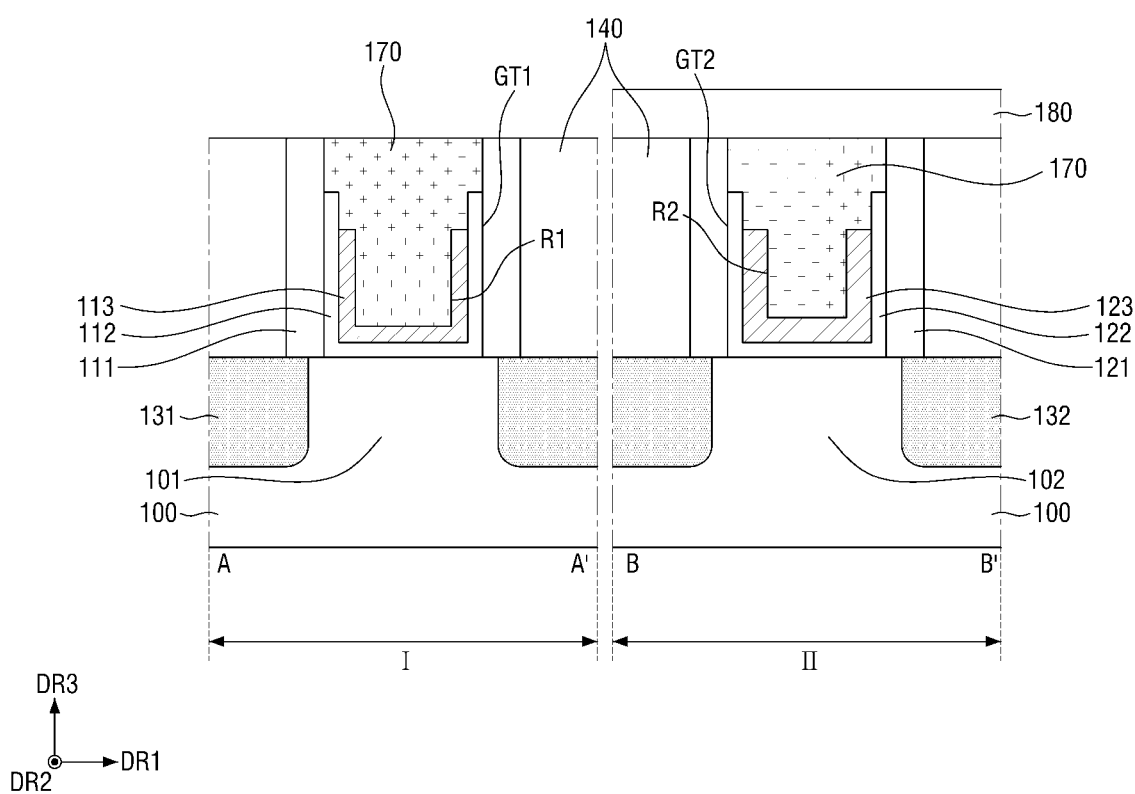

Referring to FIG. 18, a protective film 170 may be formed to fill each of the remaining region of the first gate trench GT1 and the remaining region of the second gate trench GT2. The protective film 170 may include, for example, SOH.

Subsequently, a photoresist pattern 180 may be formed to cover the interlayer insulation film 140, the second gate spacer 121 and the protective film 170 of the second region II.

Figure 19:
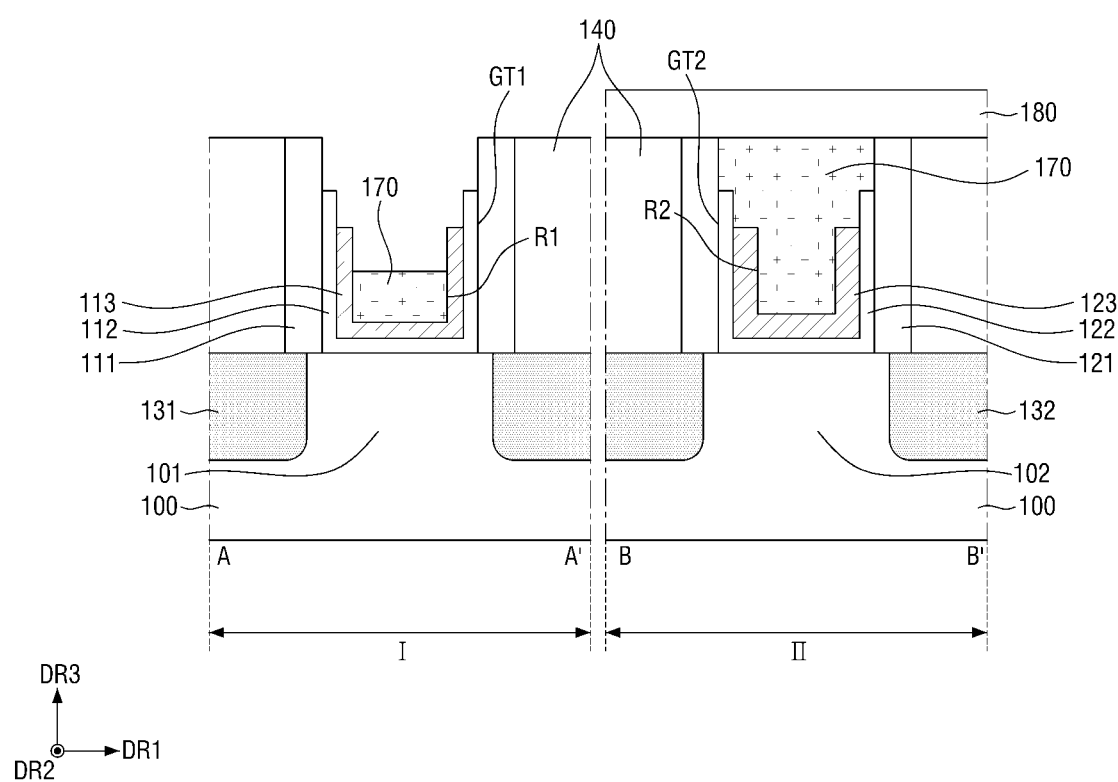

Referring to FIG. 19, a part of the protective film 170 formed in the first region I may be etched. The upper surface of the etched protective film 170 may be formed to be lower than the upper surface of the first work function film 113.

Figure 20:
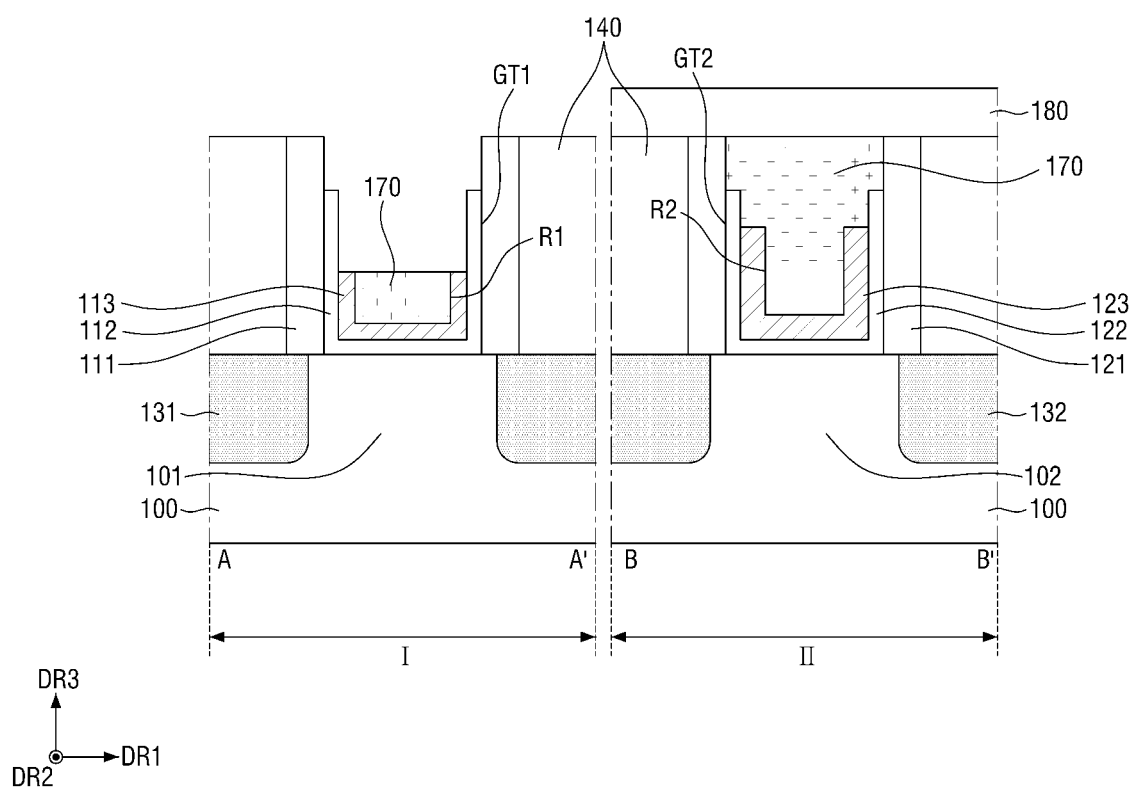

Referring to FIG. 20, a part of the first work function film 113 formed in the first region I may be etched. The upper surface of the etched first work function film 113 may be formed on the same plane as the upper surface of the protective film 170.

Figure 21:
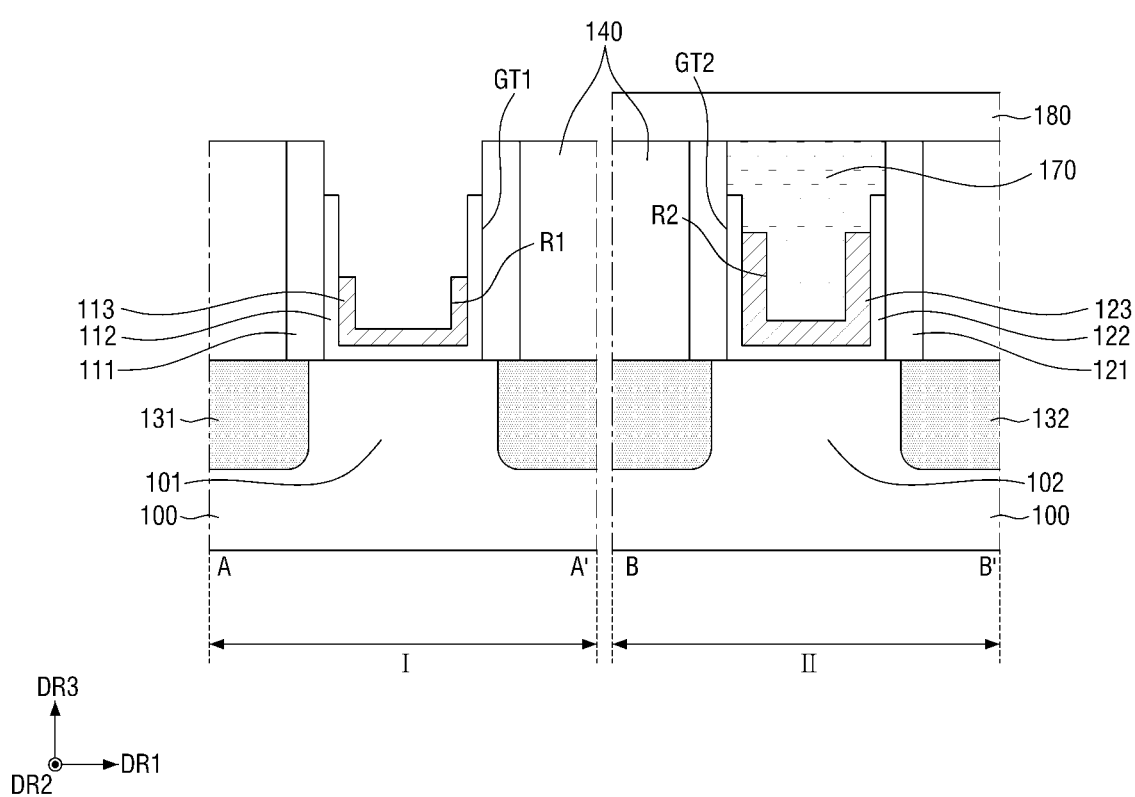

Referring to FIG. 21, the protective film 170 formed in the first region I may be completely removed.

Figure 22:
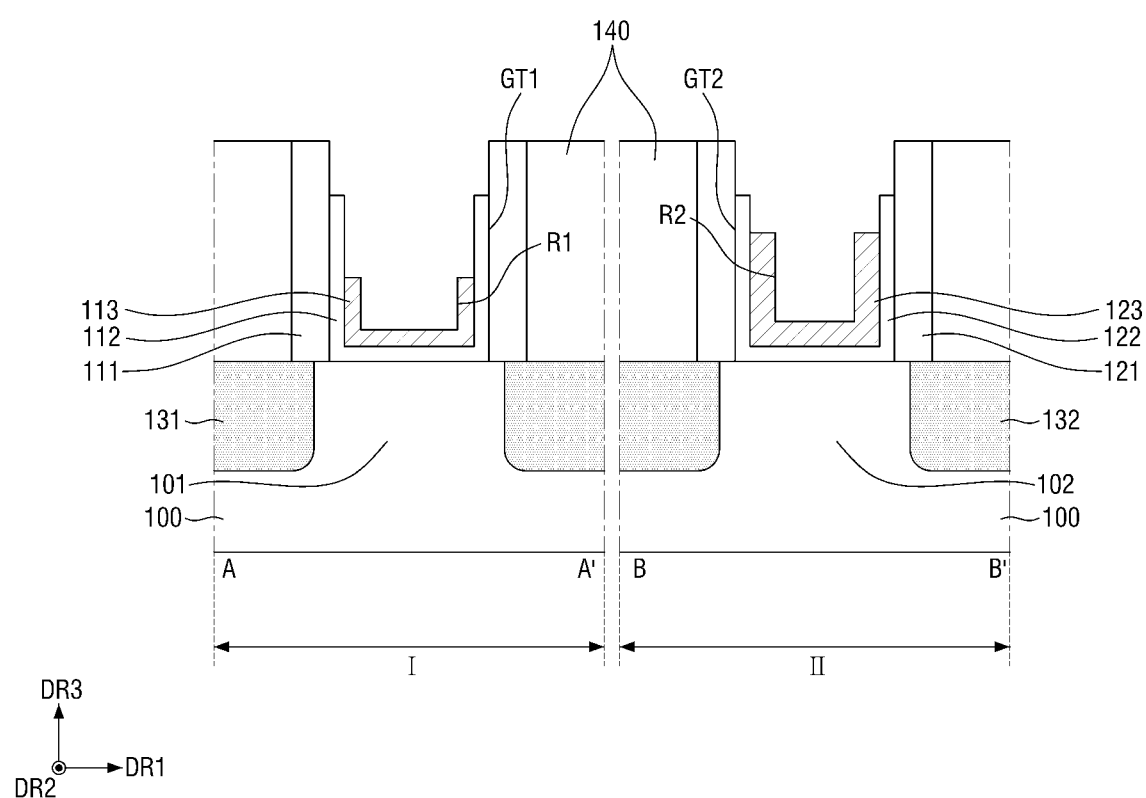

Referring to FIG. 22, the photoresist pattern 180 and the protective film 170 formed in the second region II may be removed.

Figure 23:
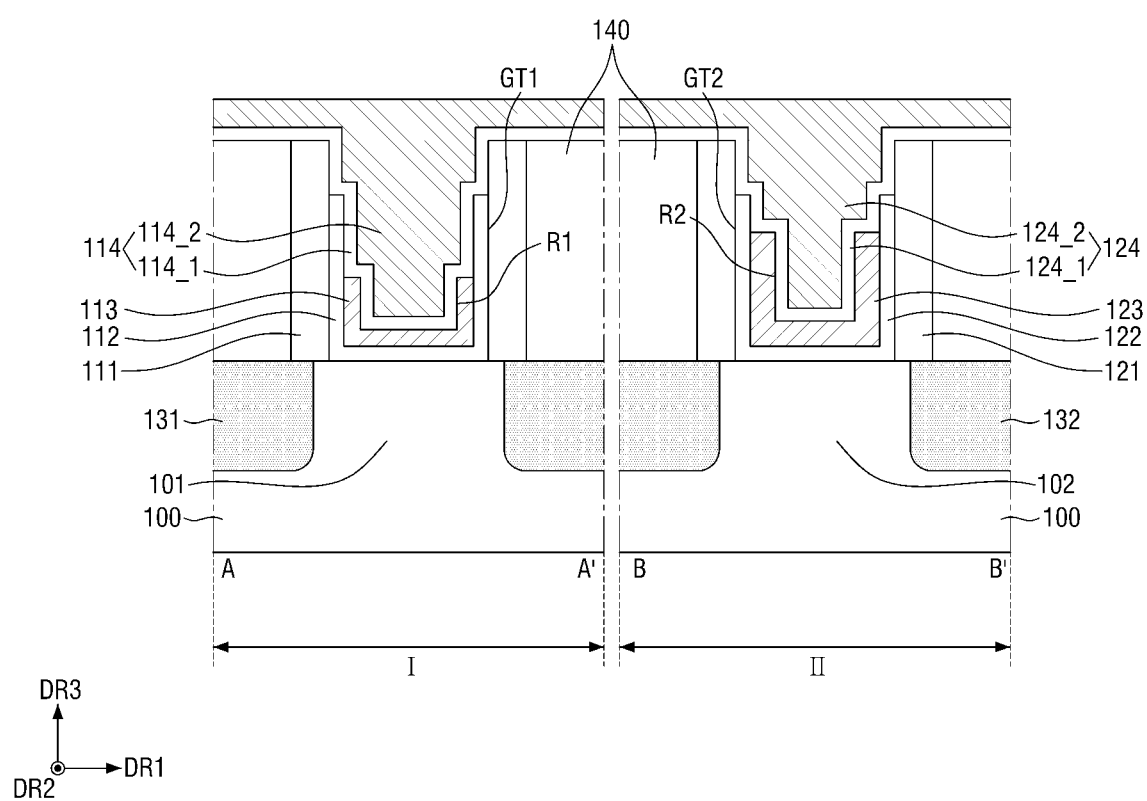

Referring to FIG. 23, in the first region I, a first lower conductive film 114_1 may be conformally formed on the upper surface of the interlayer insulation film 140 and the upper surface of the first gate spacer 111, and inside the first gate trench GT1. For example, the first lower conductive film 114_1 may be conformally formed on the first work function film 113 and on the first gate insulation film 112 inside the first gate trench GT1. In the second region II, a second lower conductive film 124_1 may be conformally formed on the upper surface of the interlayer insulation film 140 and the upper surface of the second gate spacer 121, and inside the second gate trench GT2. For example, the second lower conductive film 124_1 may be conformally formed on the second work function film 123 and on the second gate insulation film 122 inside the second gate trench GT2.

Next, a first upper conductive film 114_2 may be formed on the first lower conductive film 114_1. The first upper conductive film 114_2 may be formed to completely fill the remaining region of the first gate trench GT1. A second upper conductive film 124_2 may be formed on the second lower conductive film 124_1. The second upper conductive film 124_2 may be formed to completely fill the remaining region of the second gate trench GT2.

Referring to FIG. 2, the first upper conductive film 114_2, the second upper conductive film 124_2, the first lower conductive film 114_1 and the second lower conductive film 124_1 may be etched to expose the upper surface of the interlayer insulation film 140, the upper surface of the first gate spacer 111 and the upper surface of the second gate spacer 121. In this case, a part of the first upper conductive film 114_2 and a part of the first lower conductive film 114_1 formed inside the first gate trench GT1 may be etched. For example, the first lower and upper conductive films 114_1 and 114_2 may be etched for the upper surfaces of the first lower and upper conductive films 114_1 and 114_2 and the upper end of the first gate insulation film 112 formed on sidewalls of the first gate trench GT1 to be coplanar. In addition, a part of the second upper conductive film 124_2 and a part of the second lower conductive film 124_1 formed inside the second gate trench GT2 may be etched. For example, the second lower and upper conductive films 124_1 and 124_2 may be etched for the upper surfaces of the second lower and upper conductive films 124_1 and 124_2 and the upper end of the second gate insulation film 122 formed on sidewalls of the second gate trench GT2 to be coplanar.

Next, a first capping pattern 115 is formed in the remaining region of the first gate trench GT1, and a second capping pattern 125 may be formed in the remaining region of the second gate trench GT2. A semiconductor device shown in FIG. 2 may be fabricated through such a process.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense and not for purposes of limitation.

What is claimed is:
1. A semiconductor device comprising:
a substrate including a first region and a second region;
a first gate structure extending in a first direction on the first region of the substrate, the first gate structure including a first gate insulation film and a first work function film disposed on the first gate insulation film;

a second gate structure extending in the first direction on the second region of the substrate, the second gate structure including a second gate insulation film and a second work function film disposed on the second gate insulation film; and a first nanowire and a second nanowire sequentially stacked in a third direction on the first region of the substrate, the third direction intersecting the first direction, wherein the first gate structure surrounds each of the first nanowire and the second nanowire, wherein a first thickness of the first work function film in a second direction intersecting the first direction and the third direction is different from a second thickness of the second work function film in the second direction, and wherein a first height of the first work function film in the third direction is different from a second height of the second work function film in the third direction.

2. The semiconductor device of claim 1, wherein the first thickness of the first work function film in the second direction is smaller than the second thickness of the second work function film in the second direction.

3. The semiconductor device of claim 2, wherein the first height of the first work function film in the third direction is greater than the second height of the second work function film in the third direction.

4. The semiconductor device of claim 1, wherein the first height of the first work function film in the third direction is smaller than the second height of the second work function film in the third direction.

5. The semiconductor device of claim 1, wherein the first region is an NMOS region, wherein the second region is a PMOS region, and wherein a first width of the first gate structure in the second direction is the same as a second width of the second gate structure in the second direction.

6. The semiconductor device of claim 1, wherein a first width of the first gate structure in the second direction is greater than a second width of the second gate structure in the second direction.

7. The semiconductor device of claim 1, further comprising:

a first filling conductive film disposed inside a first recess defined by the first work function film; and a second filling conductive film disposed inside a second recess defined by the second work function film, wherein a third width in the second direction of the first filling conductive film disposed inside the first recess is different from a fourth width in the second direction of the second filling conductive film disposed inside the second recess.

8. The semiconductor device of claim 7, wherein the third width in the second direction of the first filling conductive film disposed inside the first recess is greater than the fourth width in the second direction of the second filling conductive film disposed inside the second recess.

9. The semiconductor device of claim 1, wherein an upper surface of the first work function film is formed to be lower than an upper surface of the first gate insulation film, and wherein an upper surface of the second work function film is formed to be lower than an upper surface of the second gate insulation film.

10. A semiconductor device comprising:

a substrate including a first region and a second region;

a first gate structure extending in a first direction on the first region of the substrate, the first gate structure including a first work function film and a first filling conductive film disposed inside a first recess defined by the first work function film;

a second gate structure extending in the first direction on the second region of the substrate, the second gate structure including a second work function film and a second filling conductive film disposed inside a second recess defined by the second work function film; and a first nanowire and a second nanowire sequentially stacked in a third direction on the first region of the substrate, the third direction intersecting the first direction, wherein the first gate structure surrounds each of the first nanowire and the second nanowire, wherein a first width of the first filling conductive film disposed inside the first recess in a second direction intersecting the first direction and the third direction is different from a second width of the second filling conductive film disposed inside the second recess in the second direction, and wherein a first height of the first work function film in the third direction is different from a second height of the second work function film in the third direction.

11. The semiconductor device of claim 10, wherein the first width in the second direction of the first filling conductive film disposed inside the first recess is greater than the second width in the second direction of the second filling conductive film disposed inside the second recess.

12. The semiconductor device of claim 10, wherein a first thickness of the first work function film in the second direction is different from a second thickness of the second work function film in the second direction.

13. The semiconductor device of claim 10, wherein a first thickness of the first work function film in the second direction is greater than a second thickness of the second work function film in the second direction.

14. The semiconductor device of claim 10, wherein the first height of the first work function film in the third direction is greater than the second height of the second work function film in the third direction.

15. The semiconductor device of claim 10, wherein the first region is an NMOS region, wherein the second region is a PMOS region, and wherein a third width of the first gate structure in the second direction is the same as a fourth width of the second gate structure in the second direction.

16. A semiconductor device comprising:

a substrate including an NMOS region and a PMOS region;

a first active pattern extending in a first direction on the NMOS region of the substrate;

a first gate structure extending in a second direction intersecting the first direction on the first active pattern of the NMOS region, the first gate structure including a first gate insulation film, a first work function film conformally formed on the first gate insulation film, and a first filling conductive film disposed on the first work function film;

a second active pattern extending in the first direction on the PMOS region of the substrate;

a second gate structure extending in the second direction on the second active pattern of the PMOS region, the second gate structure including a second gate insulation film, a second work function film conformally formed on the second gate insulation film, and a second filling conductive film disposed on the second work function film;

a first source/drain region disposed on at least one side of the first gate structure; and a second source/drain region disposed on at least one side of the second gate structure, wherein a first thickness of the first work function film in the first direction is smaller than a second thickness of the second work function film in the first direction, and wherein a first height of the first work function film in a third direction perpendicular to the first and second directions is smaller than a second height of the second work function film in the third direction.

17. The semiconductor device of claim 16, wherein a first width of the first gate structure in the first direction is the same as a second width of the second gate structure in the first direction.

18. The semiconductor device of claim 16, further comprising:

a first recess defined by the first work function film; and a second recess defined by the second work function film, wherein a third width in the first direction of the first filling conductive film disposed inside the first recess is greater than a fourth width in the first direction of the second filling conductive film disposed inside the second recess.

* * * * *